(12) United States Patent
Vanderheyden et al.

(10) Patent No.: US 9,378,310 B2
(45) Date of Patent: Jun. 28, 2016

(54) MATERIAL POINT METHOD MODELING IN OIL AND GAS RESERVOIRS

(71) Applicants: William Brian Vanderheyden, Katy, TX (US); Duan Zhang, Los Alamos, NM (US)

(72) Inventors: William Brian Vanderheyden, Katy, TX (US); Duan Zhang, Los Alamos, NM (US)

(73) Assignees: Los Alamos National Security, LLC, Los Alamos, NM (US); BP Corporation North America Inc., Houston, TX (US)

( * ) Notice: Subject to any disclaimer, the term of this patent is extended or adjusted under 35 U.S.C. 154(b) by 885 days.

(21) Appl. No.: 13/649,655

(22) Filed: Oct. 11, 2012

(65) Prior Publication Data

US 2013/0096890 A1    Apr. 18, 2013

Related U.S. Application Data

(60) Provisional application No. 61/546,816, filed on Oct. 13, 2011.

(51) Int. Cl.
| | | |
|---|---|---|
| *G06G 7/48* | (2006.01) | |
| *G06F 17/50* | (2006.01) | |
| *G01V 1/00* | (2006.01) | |
| *E21B 43/00* | (2006.01) | |
| *E21B 43/20* | (2006.01) | |
| *E21B 43/26* | (2006.01) | |

(52) U.S. Cl.
CPC ............ *G06F 17/5009* (2013.01); *E21B 43/00* (2013.01); *E21B 43/20* (2013.01); *E21B 43/26* (2013.01); *G01V 1/00* (2013.01)

(58) Field of Classification Search
CPC ..... G06F 17/5009; E21B 43/00; E21B 43/20; E21B 43/26; G01V 1/00

USPC ....................................................... 703/2, 10
See application file for complete search history.

(56) References Cited

PUBLICATIONS

Tremblay, B., and K. Oldakowski. "Modeling of wormhole growth in cold production." Transport in porous media 53.2 (2003): 197-214.*
Vittoratos et al., "Deliberate Sand Production from Heavy Oil Reservoirs: Potent Activation of Both Solution Gas and Aquifer Drives", Proceedings for the World Heavy Oil Congress 2008, Paper 2008-501.
Zhang et al., "Material point method applied to multiphase flows", J. Computational Physics 227 (Elsevier, 2008), pp. 3159-3173.
Zhang et al., "CartaBlanca Theory Manual: Multiphase Flow Equations and Numerical Methods", Los Alamos National Laboratory Report No. LAUR-07-3621 (2007), available at http://www.lanl.gov/projects/CartaBlanca/.

(Continued)

*Primary Examiner* — Aniss Chad

(57) ABSTRACT

A computer system and method of simulating the behavior of an oil and gas reservoir including changes in the margins of frangible solids. A system of equations including state equations such as momentum, and conservation laws such as mass conservation and volume fraction continuity, are defined and discretized for at least two phases in a modeled volume, one of which corresponds to frangible material. A material point model technique for numerically solving the system of discretized equations, to derive fluid flow at each of a plurality of mesh nodes in the modeled volume, and the velocity of at each of a plurality of particles representing the frangible material in the modeled volume. A time-splitting technique improves the computational efficiency of the simulation while maintaining accuracy on the deformation scale. The method can be applied to derive accurate upscaled model equations for larger volume scale simulations.

22 Claims, 11 Drawing Sheets

(56) References Cited

PUBLICATIONS

Kamp et al., "A New Modeling Approach for Heavy Oil Flow in Process Media", SPE paper 69270, SPE International Thermal Operations and Heavy Oil Symposium (SPE, 2001).

Giguere et al., "CartaBlanca User's Manual", Los Alamos National Laboratory Report No. LA-UR-07-8214 (2007), available at http://www.lanl.gov/projects/CartaBlanca/.

Zhang et al., "Averaged equations for inviscid two-phase flow", J. Fluid Mechanics, vol. 267 (1994), pp. 185-219.

Zhang et al., "The effects of mesoscale structures on phase interaction forces in two-phase flows and macroscopic equations", Int. J. Multiphase Flow, vol. 28 (2002), pp. 805-822.

Zhang et al., "Pressure calculation in disperse and continuous multiphase flows", Int. J. Multiphase Flow, vol. 33 (2007), pp. 86-100.

Zhang, "Ensemble phase averaged equations for multiphase flows in porous media; Part 2: a general theory", Int. J. Multiphase Flow, vol. 35 (2009), pp. 640-649.

"CartaBlanca: A High-Efficiency, Object-Oriented, General-Purpose Computer Simulation Environment", Los Alamos National Laboratory Report No. LAUR-05-6574 (2005).

Wang et al., "Numerical Modeling of Massive Sand Production", SPE 147110, SPE Annual Technical Conference (SPE, Oct. 30, 2011).

Vanderheyden et al., "Modeling Wormhole Growth and Wormhole Networks in Unconsolidated Sand Media Using the BP CHOPS Model", Paper WHOC11-427, 2011 World Heavy Oil Congress (Mar. 14-17, 2011).

Vanderheyden et al., "A New Pressure Field Based Model for Cold Heavy Oil Production with Sand", Paper WHOC12-383, 2012 World Heavy Oil Congress (Sep. 10-13, 2012).

\* cited by examiner

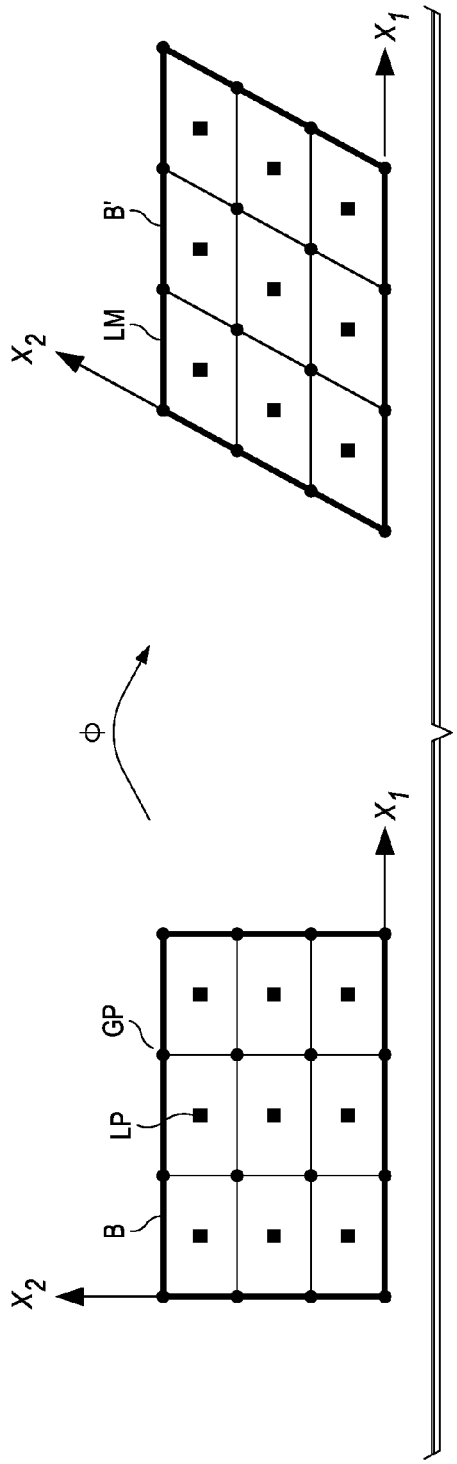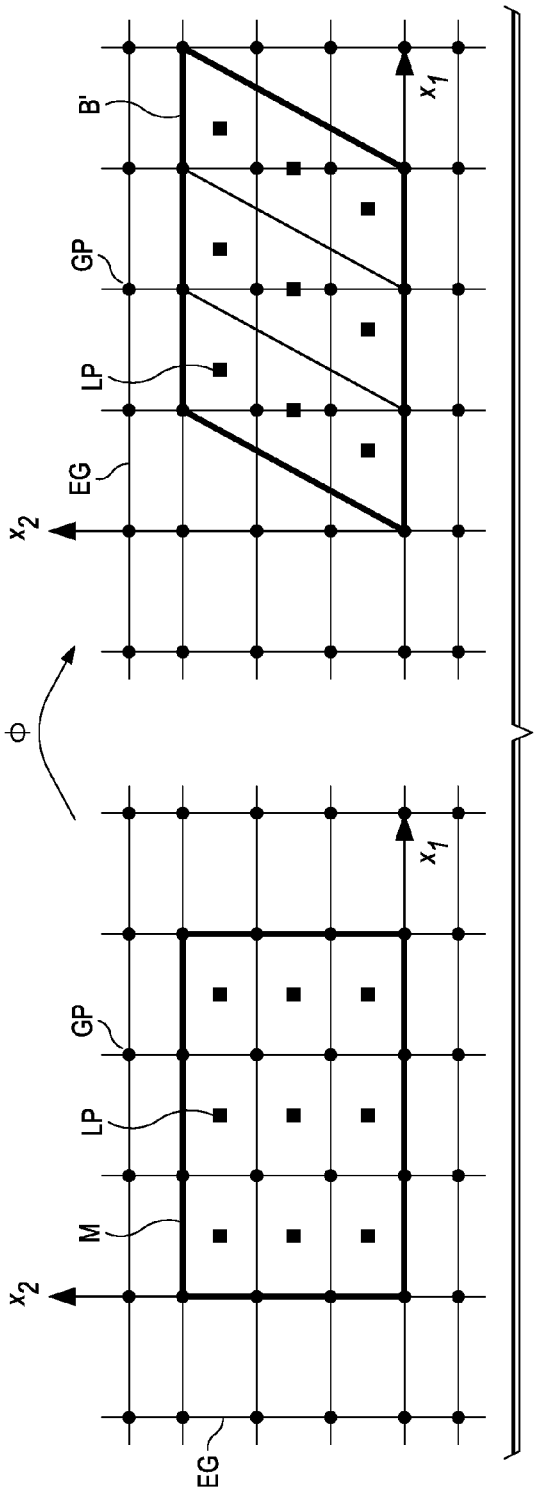
FIG. 2A
FIG. 2B

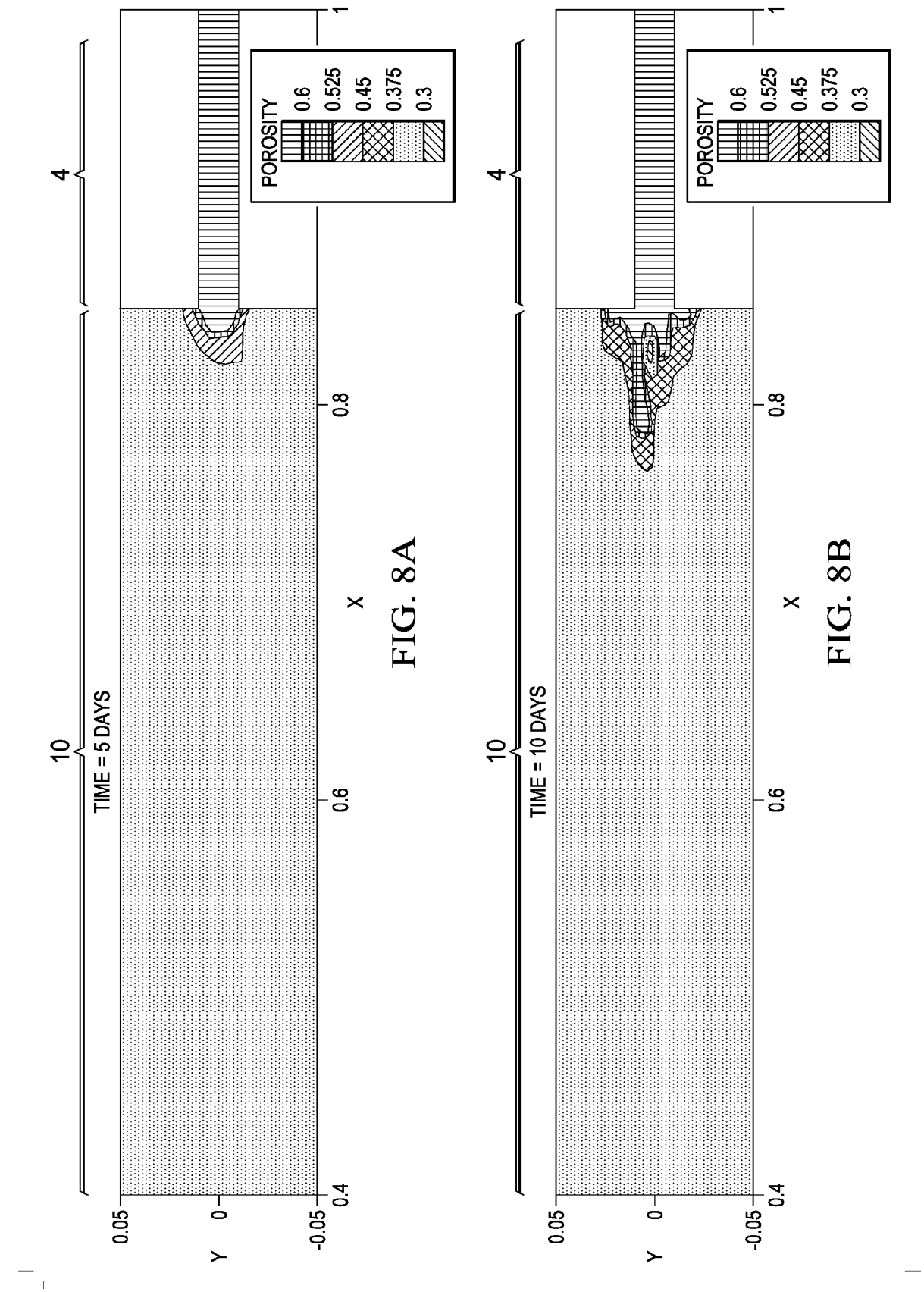

MATERIAL POINT METHOD MODELING IN OIL AND GAS RESERVOIRS

CROSS-REFERENCE TO RELATED APPLICATIONS

This application claims priority, under 35 U.S.C. §119(e), of Provisional Application No. 61/546,816, filed Oct. 13, 2011, and incorporated herein by this reference.

STATEMENT REGARDING GOVERNMENT RIGHTS

The United States Government may have certain has rights in this invention pursuant to Contract No. DE-AC52-06NA25396 between the United States Department of Energy and Los Alamos National Security, LLC for the operation of Los Alamos National Laboratory.

BACKGROUND OF THE INVENTION

This invention is in the field of oil and gas ("hydrocarbon") production. Embodiments of this invention are more specifically directed to systems and methods for modeling and simulating the behavior of hydrocarbon reservoirs.

In the current economic climate, the optimization of oil and gas production from identified reservoirs has become especially important. In this regard, considering that much of the readily available oil and gas reservoirs have been exploited or are currently in production, production of oil and gas in less producible forms, or from formations that are more reluctant to release their hydrocarbons, have become of increased interest. For example, large reservoirs of natural gas yet remain in so-called "tight" formations, in which the flow of gas into a production well is greatly restricted by the nature of the gas-bearing rock. These low permeability formations include tight sands, gas shales and gas coals, requiring such actions as hydraulic fracturing ("fracing") to raise production levels. In the oil context, production of heavy oil from unconsolidated sands ("UCS") has become economically attractive, even from cold climates such as northern North America. Especially in difficult formations such as these, the high economic stakes require operators to devote substantial resources toward effective management of oil and gas reservoirs and individual wells within production fields.

Recent advances in computational capability, in combination with the high economic stakes involved in reservoir and well management, have motivated reservoir engineers to develop models of reservoir behavior, for example based on seismic and other geological surveys of the production field, along with conclusions that can be drawn from well logs, pressure transient analysis, and the like. These models are applied to conventional reservoir "simulator" computer programs, by way of which the reservoir engineer can analyze the behavior of the reservoir over its production history, and by way of which the engineer can simulate the behavior of the reservoir in response to potential reservoir management actions (i.e., "what-if" analysis). An example of such a reservoir management action is the injection of gas or water into the reservoir to provide additional "drive" as reservoir pressure drops over cumulative production. Modern reservoir simulation systems and software packages assist the operator in deciding whether to initiate or cease such "waterflood" operations, how many wells are to serve as injection wells, the locations of those injectors in the field, and the like.

Some reservoir simulators approximate fluid flow in the reservoir on a grid of geometric elements, and numerically simulate fluid flow behavior using finite-difference or finite-element techniques to solve for pressure and flow conditions within and between elements in the grid. In such simulation, the state of the reservoir model is stepped in time from some defined initial conditions, allowing the simulation package to evaluate inter-element flows, pressures at each grid element, and the like, at each point within a sequence of time steps. The results of this simulation can, if reasonably accurate, provide the reservoir engineer with insight into the expected behavior of the reservoir over time.

Because the geographical scale of typical reservoir models is relatively large, extending over hundreds of yards or several miles, corresponding finite-difference production field models of even modest complexity can become quite large, in the number of grid cells or mesh nodes. The computational complexity and cost of simulating the behavior of models including large numbers of cells or nodes can thus become prohibitive, even with modern high performance computer systems. As such, it is useful to reduce the number of grid cells in the model, by increasing the volume of each grid cell. For example, a typical grid cell in a reasonably manageable finite-difference model of a large production field may be on the order of hundreds of feet on a side. And because the time frame over which the simulation is carried out is often relatively long (e.g., from weeks to years), the time steps between solution points can be relatively long (e.g., once daily to monthly) to keep the computational burden somewhat reasonable.

However, it has been observed, in connection with this invention, that some physical phenomena in some of these newly-exploited formations cannot be adequately modeled at a large geographical scale and a large time scale. For example, the production of heavy oil from UCS using the technique of Cold Heavy Oil Production with Sand ("CHOPS") involves mechanisms that are not accurately modeled at large geographical and time scales.

More specifically, in this CHOPS recovery method, unconsolidated sand particles are produced along with the heavy oil being withdrawn from the formation. This sand removal results in structural voids in the sub-surface, such voids referred to in the art as "wormholes". These wormholes tend to be generally cylindrical zones of high permeability originating from the wellbore perforations, with the high permeability of course expressing the effect of the withdrawing of sand from the formation. One conventional CHOPS simulation approach approximates wormholes as wellbores growing in the direction of the highest porosity (e.g., as indicated in a model of the sub-surface formations), at explicitly set growth rates. In essence, this approach computes a priori static wormhole trajectories that are independent of the sub-surface pressure gradient, in advance of executing the reservoir flow simulation. This simulation model has been shown to reasonably capture some empirical data patterns, including the effects of solution gas drive and aquifer support, as described in Vittoratos et al., "Deliberate Sand Production from Heavy Oil Reservoirs: Potent Activation of Both Solution Gas and Aquifer Drives", *Proceedings for the World Heavy Oil Congress* 2008, Paper 2008-501, incorporated herein by this reference. But it has been recognized that this simulation of wormhole growth is necessarily inaccurate, based on anecdotal evidence that factors other than porosity are important in the growth and branching of such wormholes. In addition, it is contemplated according to this invention that the large modeled volumes and long time periods over which conventional reservoir simulation is applied, as compared with the small regions and short time frames at which the wormhole formation mechanism occurs, limits the ability of current-day simulation frameworks to predict and simulate wormhole formation.

As mentioned above, secondary recovery actions such as water injection are important for maximizing production from existing reservoirs, including moderately heavy oil-bearing UCS formations, especially in this economic climate. As known in the art, waterflood "fingers" are commonly formed from the injection wellbores, especially in relatively loose formations such as sands. These waterflood fingers amount to voids in the formation that become essentially filled with the injected water. While secondary waterflooding is not typically used in conjunction with the CHOPS recovery technique, wormholes can form unintentionally at producer wells in UCS formations. Sub-surface connection between such a wormhole and a waterflood finger can cause a "matrix bypass event" in which the injected water is short-circuited to a producing well, disrupting oil production at that well and preventing significant drive pressure from being applied to the reservoir. Improved accuracy in the simulation of wormhole formation in UCS formations would therefore be beneficial in assisting in the placement and management of injection wells in the UCS production field, and thus in the optimization of production from the field.

Other phenomena in the production of oil and gas also occur over short time frames and small volumes in the larger reservoir. For example, hydraulic fracturing of tight gas formations is important in maximizing production from tight gas formations; the mechanisms involved in creating the fractures both mechanically and chemically, and in injecting "proppants" of the appropriate size and composition to keep the fractures open, operate on relatively small relevant volumes and short time frames, and are thus poorly modeled by conventional simulation tools. Similarly, the physical mechanisms involved in oil sand perforators also operate over short time periods and small volumes.

By way of further background, a numerical technique referred to as "material point methods" ("MPM") has been used in the simulation of the effects of weapons and ordnance. MPM modeling uses both a Eulerian mesh and Lagrangian points to represent a material. The Lagrangian integration points move through the Eulerian mesh during the simulation time period. In a general sense, these particles move independently relative to one another (and are not connected to one another, as are mesh nodes in the mesh), but are influenced by their near neighbors at each simulation time point, according to particular shape functions. In each simulation time step, equations of motion are solved at grid cells of the Eulerian mesh, and for the Lagrangian particles moving through that mesh. MPM methods have been applied to simulations of projectile-target interaction, including the interaction of an explosive projectile impacting a metal body and explosions near modeled buildings.

BRIEF SUMMARY OF THE INVENTION

Embodiments of this invention provide a method and system for modeling and simulating the behavior of a hydrocarbon reservoir over a wide variation in time or geographical scale, or both.

Embodiments of this invention provide such a modeling and simulation method and system that can be executed via workstation-class and similar computer systems.

Embodiments of this invention provide such a modeling and simulation method and system that can accurately model and simulate the formation of sub-surface wormhole structures in cold heavy oil production with sand.

Embodiments of this invention provide such a modeling and simulation method and system that can model and simulate wormhole formation within a well-pair geographical scale, in which waterflood injection is applied at a paired injector well.

Embodiments of this invention provide such a modeling and simulation method and system that can be applied to the multi-scale simulation of gas shale hydraulic fracturing, including the effects of chemical transport and the injection of proppants.

Other objects and advantages of this invention will be apparent to those of ordinary skill in the art having reference to the following specification together with its drawings.

A computerized method and system for modeling physical and chemical mechanisms occurring within short time frames, or small volumes, or both, in connection with the development and production of a hydrocarbon (oil, gas, or both) production field is provided. In particular, this method and system models the effect of deformation and other change (e.g., structural degradation or damage) to frangible material of the formation, as the hydrocarbon or other fluids flow over time. The volume of interest is modeled by the combination of an Eulerian mesh representative of the sub-surface structure through which the fluid flows, with Lagrangian particles that move through the mesh during the simulation time period representative of the degrading solid material. State equations for fluid flow and particle behavior (e.g., momentum) are solved at each simulation time step, from which the behavior of the fluid and solid structure can be derived.

In some embodiments of the invention, efficiency in carrying out the simulation of the fluid flow and structural change is attained by way of a time-splitting approach. At each of a sequence of relatively large simulation time steps, conservation laws and equations of state for fluid flow and particle behavior are evaluated, ignoring the buildup of elastic stress in, and assuming zero velocity for, the undamaged (i.e., stationary) particles; damaged (i.e., mobile) particles that have been freed from the formation are assigned the velocity of the fluid. For the example of modeling wormhole formation in Cold Heavy Oil Production with Sand (CHOPS), Lagrangian integration points representative of the undamaged sand particles remaining in the unconsolidated sand formation are assumed to have constant stress and zero velocity, while the integration points for the sand particles released from the formation have a velocity influenced by the fluid at their respective locations. At selected times in the overall simulation time frame and at selected locations in the model volume, the fluid parameters are assumed constant over a sequence of relatively small simulation time steps. Conservation laws and equations of state for the particles are then solved at each of these smaller time steps, including the effects of elastic stress on those particles at each time point. In addition, the stresses evaluated at these smaller time steps are applied to a failure model to determine whether the corresponding physical particles have become mobile. In the CHOPS example, evaluation of the stresses on each particle and application to the failure model determines whether that particle has broken from the formation (i.e., whether the wormhole has grown).

Additional mechanisms may be included within the simulation. For the example of the simulation of waterflood in an unconsolidated sand (UCS) formation, the results of material point model simulations may be upscaled to larger scale calculations, without performing the material point model calculations at that larger scale. For example, upscaling to the well-pair scale in this manner enables efficient simulation of the combination of waterflood injection at a second well and the growth of wormholes from the producing wellbore, indicating whether the well pair is vulnerable to a matrix bypass event, and to short-circuiting of the waterflood.

BRIEF DESCRIPTION OF THE SEVERAL VIEWS OF THE DRAWING

FIGS. 2a and 2b are graphical representations of Eulerian and Lagrangian representations of the deformation of a body.

FIGS. 8a through 8e are plots illustrating an example of the results of the simulation process of FIG. 6, according to an embodiment of the invention.

DETAILED DESCRIPTION OF THE INVENTION

This invention will be described in connection with its embodiments, namely as implemented into a computerized system and method of operating the same for modeling and simulating the fluid and structural behavior in the sub-surface of a production field from which oil is produced by the Cold Heavy Oil Production with Sand (CHOPS) process, as it is contemplated that this invention will be especially beneficial in such an application. It is also contemplated, however, that embodiments of this invention can be beneficially implemented in other situations and applications in the development and production of oil, gas, and other hydrocarbons, such as hydraulic fracturing and oil sand perforation. Accordingly, it is to be understood that the following description is provided by way of example only, and is not intended to limit the true scope of this invention as claimed.

Figure 1:
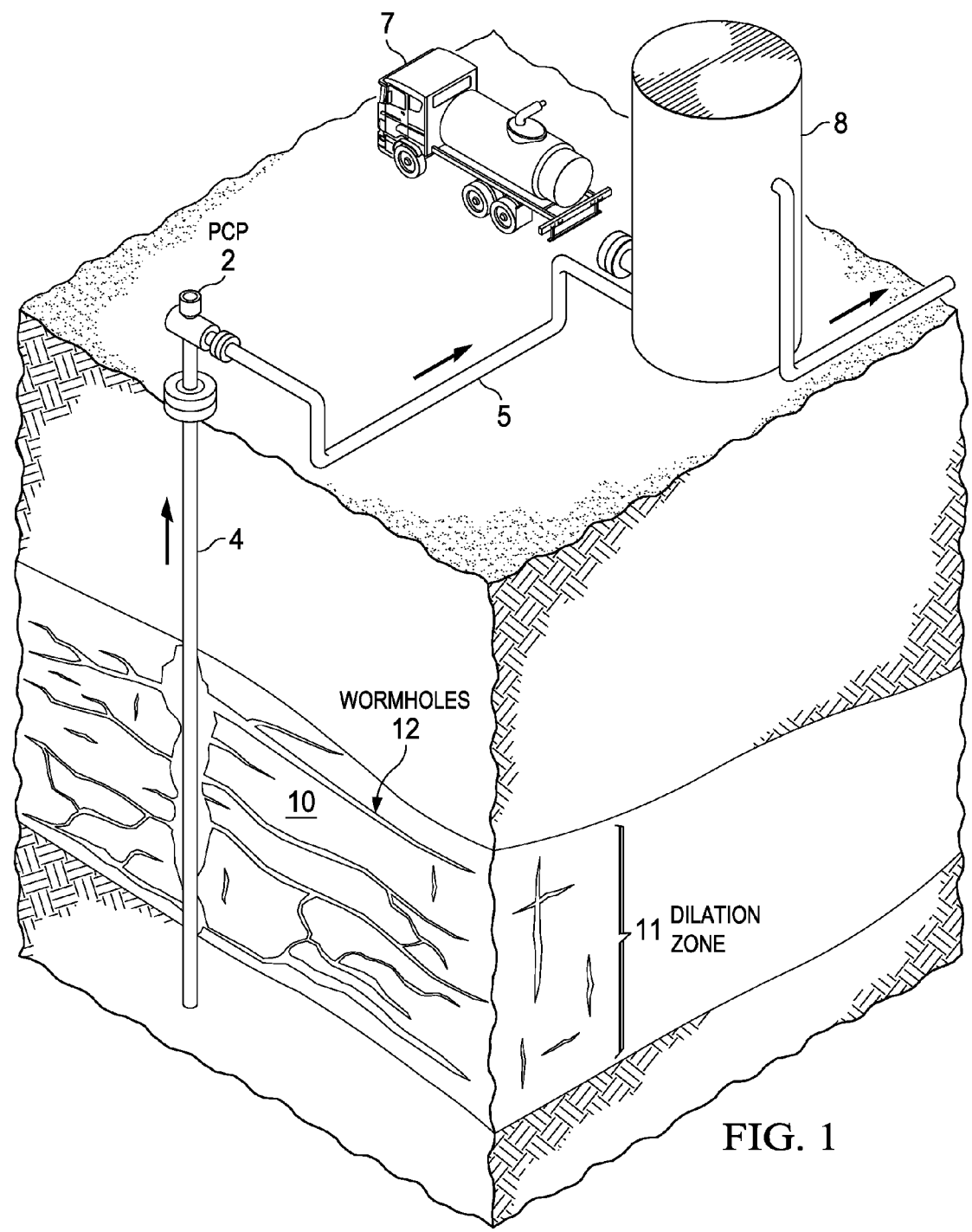
FIG. 1 is a perspective schematic view of a portion of the sub-surface including a producing oil well according to the Cold Heavy Oil Production with Sand (CHOPS) method, and in connection with which embodiments of this invention are implemented.

FIG. 1 schematically illustrates, in a perspective view, the production of oil by way of the CHOPS process. In this illustrated example, wellbore 4 extends from wellhead 2 into the earth, to a depth reaching through unconsolidated sand (UCS) formation 10, which in this case is an oil-bearing stratum in the earth. Perforations (not shown in FIG. 1) are located along wellbore 4 at depths corresponding to UCS formation 10, so that fluids are produced from formation 10, up wellbore 4 to wellhead 2 at the surface.

According to the CHOPS method, oil in formation 10 is produced and communicated to surface vessel 8 in the form of a slurry in which sand grains from formation 10 are entrained. In a general sense, grains of a UCS remain in place due to the gravitational pressure exerted by the weight of the overburden strata, in combination with the friction between adjacent sand grains. At locations beginning from the wall of wellbore 4, the shear stress exerted by the oil as produced causes dilation in the UCS and eventually liquefaction at the boundary of the UCS with wellbore 4, allowing sand grains to break away from UCS formation 10 and become entrained into a slurry with the heavy oil. The sand grains are separated from the oil at the surface, and disposed of via sand truck 7 or other appropriate facilities.

As grains of UCS formation 10 separate and are produced via wellbore 4, voids in formation 10 begin to form. These voids grow, with cumulative production, from the interface of the sand matrix still in place in formation 10, extending into formation 10 by some distance, commonly in the shape of wormholes 12 as shown in FIG. 1. Depending on the properties of formation 10 itself, the sub-surface pressure gradients, and the stresses applied by the flowing oil and other fluids in the formation during production, these wormholes 12 may branch at distances away from wellbore, or may accelerate or decelerate as production continues. Oil is also depleted from UCS formation 10 at distances away from wormholes 12, as shown by dilation zone 11; within this dilation zone 11, the sand grains may dilate (i.e., exhibit increased porosity per unit volume), but the vertical overburden stress and local friction remain sufficient to hold the individual grains in place.

As evident from FIG. 1, various mechanisms are in play if one is to simulate or model the production of oil from UCS formation 10. On one hand, large geographical scale effects of reservoir pressure (particularly if "drive" from a nearby aquifer or other pressure source is present) govern the production of fluid from wellbore 4 over the long term (in the time domain). On the other hand, the rate and direction of wormhole growth is highly localized, occurring essentially at the interface between the sand matrix and the oil-sand slurry, and thus occurring over a short time scale in those small volumes. Accordingly, as mentioned above, conventional modeling and simulation tools are unable to accurately and rigorously simulate the production of heavy oil and the formation of wormholes 12 via the CHOPS process, as in this context.

According to this invention, it has been discovered that the material point methods (MPM) of simulation of multiphase flows, which have been used in analysis of ballistics and explosion processes and events, can be effective in the simulation of material degradation in the context of oil and gas reservoirs and wells. More specifically, according to this invention, it has been discovered that the ballistics and explosion mechanisms conventionally addressed by MPM simulation are sufficiently analogous to phenomena such as the mechanism of sand liquefaction at the matrix/slurry interface in CHOPS production, the mechanism of hydraulic fracturing, including chemical assistance and initiation of such "fracing" and the introduction of proppants into the fractures, the mechanisms involved in oil sand perforation, and other similar actions and effects in oil and gas production. The embodiments of the invention described below in this specification are based on this discovery that this conventional MPM tool can be used in these contexts, to which MPM has not heretofore been applied.

Theory of Operation

As described in Zhang et al., "Material point method applied to multiphase flows", *J. Computational Physics* 227 (Elsevier, 2008), pp. 3159-73, incorporated herein by reference, the material point model (MPM) numerical technique is a known method for simulations involving deformable structures. According to the MPM approach, the material under analysis is represented both by a Eulerian mesh and by Lagrangian integration points, with the Eulerian mesh remaining fixed through the simulation time, while the Lagrangian points move through the mesh as the material deforms. The Lagrangian points are not structurally connected to one another, each point moving independently through the coordinate system, but are influenced by neighboring points according to a shape function. As described in the Zhang et al. article, MPM simulation has been observed to be useful in cases of large deformations in the material under consideration, without the "tangling" of the Lagrangian mesh that occurs in conventional approaches to simulating deformation of material bodies.

FIGS. 2a and 2b illustrate the distinction between conventional Lagrangian approaches and the MPM technique in simulating the deforming material. FIG. 2a illustrates two-dimensional body B prior to, and after, a deformation φ in response to a force exerted in the $+X_1$ direction (into deformed body B'). As shown in the left-hand side of FIG. 2a, body B is represented as coincident with several Lagrangian mesh nodes GP, the space among which can be considered as grid cells in the two-dimensional space. Lagrangian integration points LP are also shown in FIG. 2a, for the sake of comparison. Deformation φ in the $+X_1$ direction (non-uniform deformation with displacement increasing for increasing position in the $+X_2$ direction) results in deformed body B'. As shown in FIG. 2a, this deformation is represented by a corresponding deformation in Lagrangian mesh LM itself; the mesh nodes GP move along with the displacement of the deformation φ. If the simulation interval were extended further, the grid cells within Lagrangian mesh LM would shrink to infinitesimal size in at least one dimension; more complex deformations can cause the Lagrangian mesh to actually tangle.

In contrast, FIG. 2b illustrates the effect of the same deformation φ of body B according to a representation as useful in MPM simulation. The left-hand image in FIG. 2b corresponds essentially to that of FIG. 2a; Eulerian grid EG is illustrated as extending beyond the boundary of body B. In this case, Eulerian grid EG and its mesh nodes GP define a space within which body B resides. Lagrangian points LP are in the same locations as before. After deformation φ, however, Eulerian grid EG and its mesh nodes GP remain at the same location as before, regardless of the motion of body B into deformed body B'. The change in body B' is represented instead by the movement of Lagrangian points LP within the fixed Eulerian grid EG.

The MPM numerical technique essentially combines the Eulerian mesh and Lagrangian points to represent the deformation of a material. More specifically, at each time step, MPM solves for motion of the Lagrangian points (i.e., particles) and also the state quantities at the Eulerian mesh nodes. During deformation, the Eulerian mesh or grid stays fixed in position, while the Lagrangian points move while carrying quantity values such as mass, microscopic density, velocity, and the like. The quantity values of each Lagrangian point (or changes in those quantities) are interpolated back and forth between the Eulerian grid and the Lagrangian points based on specified shape functions. Further detail in the theory of operation of one implementation of the MPM technique is described in Zhang et al., "CartaBlanca Theory Manual: Multiphase Flow Equations and Numerical Methods", Los Alamos National Laboratory Report No. LAUR-07-3621 (2007), available at http://www.lanl.gov/projects/CartaBlanca/, and incorporated herein by this reference. As such, the MPM technique has been applied to problems involving interactions of different materials or fluids.

According to this invention, MPM numerical simulation is used in the simulation of the effect of fluid flow at a pressure upon the structure of a frangible material. More specifically, the Eulerian mesh nodes define a structure through which a fluid, such as oil, water, or chemicals, flows over the simulation time, while Lagrangian points represent particles of the frangible material, such as sand or shale. According to embodiments of this invention, however, it is to be understood that these Lagrangian "particles" are not necessarily limited to individual physical particles of the frangible material, but may instead correspond to larger pieces or agglomerations of that material. This numerical technique thus enables the simulation and analysis of damage or degradation of the frangible material in response to the force applied by the fluid.

As applied to evaluation of the CHOPS technique described above, according to this invention, the MPM numerical technique represents particles of unconsolidated sand (UCS) by way of the Lagrangian points, and represents the flow of oil through the fixed Eulerian mesh. Equations of state and conservation laws for each of the particles, and of fluid flow at each mesh node, are then solved at time steps within the simulation time period. As described in the Zhang et al. *J. Computational Physics* paper incorporated above, this solution is performed in a subspace of continuous functions in which all functions take the form:

$$q_k(x,t) = \Sigma_{j=1}^N q_{kj}(t) S_j(x) \qquad (0)$$

where N is the number of mesh nodes in the domain, $q_{kj}$ is the value of quantity q of phase k at mesh node j, x and t are location and time variables, respectively, and $S_1$ is the shape function associated with the mesh nodes. As described in the "CartaBlanca Theory Manual" incorporated above, different shape functions may be used, depending on the type of elements; for example, bi-linear shape functions are suitable for quadrilateral and hexahedral elements. In this example, and according to embodiments of this invention, the state equations solved correspond to expressions for momentum of the oil at each mesh node, and for momentum of each sand particle. For example, the momentum equation for oil at a given mesh node can be expressed as:

$$\theta_o \rho_o^0 \frac{du_o}{dt} = -\theta_o \nabla P + \nabla \cdot (\theta_o \sigma_v) - \theta_o \theta_s f_{so} \qquad (1)$$

where $\theta_o$ is the volume fraction of oil, $\theta_S$ is the volume fraction of sand, $\rho_o^0$ is a nominal density of the oil, P is the pressure at the mesh node, $\sigma_v$ is a viscous stress tensor, and $f_{so}$ represents an interaction between sand and oil in the nature of drag, and $u_o$ is the velocity vector of oil at that mesh node. As such, the left side of the equation represents momentum of oil at the mesh node, with the right side of the equation corresponding to a sum of a pressure gradient term, a viscous stress term, and a term representing drag between the oil and sand. The momentum equation for a sand particle can similarly be expressed as:

$$\theta_s \rho_s^0 \frac{du_s}{dt} = -\theta_s \nabla P + \nabla \cdot [\theta_s(\sigma_s + PI)] + \nabla \cdot (\theta_s \sigma_v) - \theta_o \theta_s f_{so} \qquad (2)$$

where $\rho_S^0$ is a nominal density of the sand, P is the pressure at the location of the particle, $(\sigma_s + PI)$ represents a linear elastic stress term, and $u_s$ is the velocity vector of that particle of sand. As such, the left side of the equation represents momentum of the sand particle, with the right side of the equation corresponding to a sum of a pressure gradient term, an elastic stress term, a viscous stress term, and a term representing drag between the oil and sand. The conservation laws are expressed by way of the conservation of mass for both oil and sand, based on the volume fraction and velocity of each substance, as follows:

$$\frac{\partial \theta_o}{\partial t} + \nabla \cdot (\theta_o u_o) = -\frac{\theta_o}{c_0^2 \rho_o}\left(\frac{\partial P}{\partial t} + u_o \cdot \nabla P\right) \qquad (3a)$$

and $$\frac{\partial \theta_s}{\partial t} + \nabla \cdot (\theta_s u_s) = 0 \qquad (3b)$$

In addition, the continuity constraint that the volume fractions of all materials sum to unity, at each grid cell, enforces an additional conservation law in this system. The right-hand side of equation (3a) accounts for compressibility effects of the oil, with c being the speed of sound in the medium. While this equation (3a) effectively treats compressibility as a constant, an additional state equation may also be derived to also solve for gas saturation, such as described in Kamp et al., "A New Modeling Approach for Heavy Oil Flow in Process Media", SPE paper 69270 (SPE, 2001), incorporated herein by this reference.

According to embodiments of this invention, parameters in equations (1) and (2) in this example are set at initial conditions, corresponding to the initial time point in the simulation interval, based on such extrinsic information representative of the sub-surface, including pressures, sand properties, and oil properties, as based on seismic surveys, well logs, measurements acquired from wells at or near the volume under analysis, existing models of the sub-surface, and the like. Given these initial conditions, the momentum equations are then solved at each time point over the simulation time interval, ensuring that the conservation laws of equations (3a) and (3b) are honored in each solution. As a result, at each time point, the flow of oil in response to the pressure conditions in the sub-surface, and as affected by the condition of the unconsolidated sand and its interaction with that oil, is resolved at each mesh node in the modeled volume, along with the velocity of each sand particle in the modeled volume along with the stresses applied to that particle by the pressure gradient and the flowing oil phase. If the velocity of a given sand particle increases dramatically from effectively zero over one or more time intervals, one can conclude that the corresponding sand particle has broken away from the unconsolidated sand matrix.

As mentioned above, embodiments of this invention can be applied to the simulation of other processes and behaviors of interest in and related to the production of oil and gas, particularly in the simulation of the behavior of sub-surface strata at or near one or more wellbores. In those other processes and behaviors, the state equations and conservation laws will of course differ from those described above in connection with the momentum and mass of oil and sand in a CHOPS production environment. For example, one or more equations expressing temperature effects will be involved in the simulation of steam-based recovery processes in an oil and gas reservoir, for example in the form of an energy conservation equation. Other state equations and conservation laws, pertaining to these and other mass and energy relationships, will be applicable in other simulated processes.

Particular embodiments of systems and methods operating according to this theory of operation, as applied to oil and gas reservoirs and production techniques, will now be described in detail.

Computerized System

Figure 3:
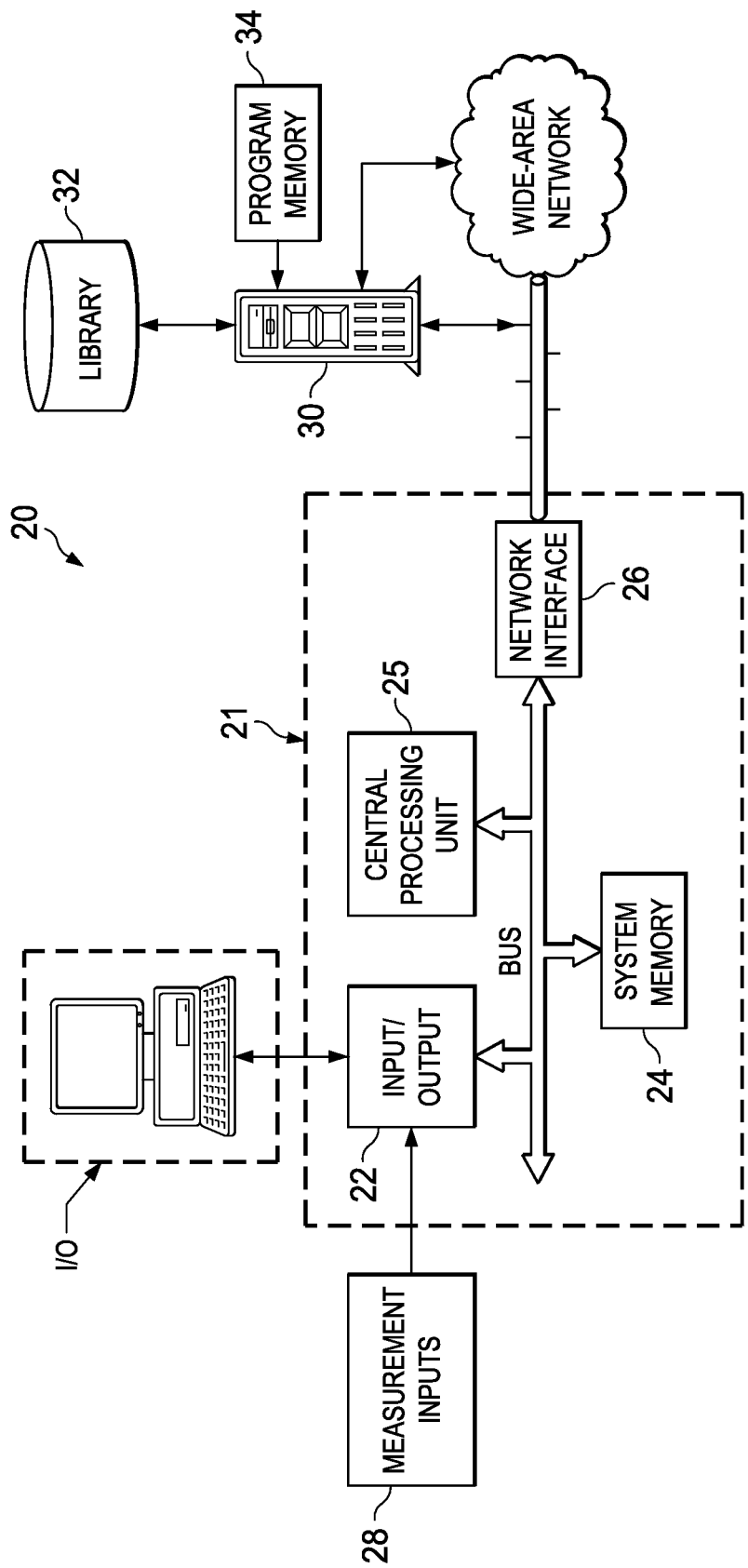
FIG. 3 is an electrical diagram, in schematic form, of a networked computer system programmed to execute various processes in the modeling and simulation of a gas reservoir, according to embodiments of the invention.

Embodiments of this invention are directed to a computerized method and system for simulating the behavior of a sub-surface region of the earth during oil and gas production operations, and more specifically for carrying out a simulation of the fluid and structural behavior of the modeled region. FIG. 3 illustrates, according to an exemplary embodiment, the construction of simulation system ("system") 20, which performs the operations described in this specification to efficiently execute a simulation of the interaction of fluid and formation materials by way of a material point model (MPM) approach. In this example, system 20 can be realized by way of a computer system including workstation 21 connected to server 30 by way of a network. Of course, the particular architecture and construction of a computer system useful in connection with this invention can vary widely. For example, system 20 may be realized by a single physical computer, such as a conventional workstation or personal computer, or alternatively by a computer system implemented in a distributed manner over multiple physical computers. Accordingly, the generalized architecture illustrated in FIG. 3 is provided merely by way of example.

As shown in FIG. 3 and as mentioned above, system 20 includes workstation 21 and server 30. Workstation 21 includes central processing unit 25, coupled to system bus BUS. Also coupled to system bus BUS is input/output interface 22, which refers to those interface resources by way of which peripheral functions I/O (e.g., keyboard, mouse, display, etc.) interface with the other constituents of workstation 21. Central processing unit 25 refers to the data processing capability of workstation 21, and as such may be implemented by one or more CPU cores, co-processing circuitry, and the like. The particular construction and capability of central processing unit 25 is selected according to the application needs of workstation 21, such needs including, at a minimum, the carrying out of the functions described in this specification, and also including such other functions as may be executed by system 20. In the architecture of system 20 according to this example, system memory 24 is coupled to system bus BUS, and provides memory resources of the desired type useful as data memory for storing input data and the results of processing executed by central processing unit 25, as well as program memory for storing the computer instructions to be executed by central processing unit 25 in carrying out those functions. Of course, this memory arrangement is only an example, it being understood that system memory 24 can implement such data memory and program memory in separate physical memory resources, or distributed in whole or in part outside of workstation 21. In addition, as shown in FIG. 3, workstation 21 can also receive, via input/output function 22, measurement inputs 28 from sensors and transducers deployed at wells in the production field. These measurement inputs can be stored in a memory resource accessible to workstation 21, either locally or via network interface 26.

Network interface 26 of workstation 21 is a conventional interface or adapter by way of which workstation 21 accesses network resources on a network. As shown in FIG. 3, the network resources to which workstation 21 has access via network interface 26 includes server 30, which resides on a local area network, or a wide-area network such as an intranet, a virtual private network, or over the Internet, and which is accessible to workstation 21 by way of one of those network arrangements and by corresponding wired or wireless (or both) communication facilities. In this embodiment, server 30 is a computer system, of a conventional architecture similar, in a general sense, to that of workstation 21, and as such includes one or more central processing units, system buses, and memory resources, network interface functions, and the like. According to this embodiment of the invention, server 30 is coupled to program memory 34, which is a computer-readable medium that stores executable computer program instructions, according to which the operations described in this specification are carried out by analysis system 20. In this embodiment of the invention, these computer program instructions are executed by server 30, for example in the form of an interactive application, upon input data communicated from workstation 21, to create output data and results that are communicated to workstation 21 for display or output by peripherals I/O in a form useful to the human user of workstation 21. In addition, library 32 is also available to server 30 (and perhaps workstation 21 over the local area or wide area network), and stores such archival or reference information as may be useful in system 20. Library 32 may reside on another local area network, or alternatively be accessible via the Internet or some other wide area network. It is contemplated that library 32 may also be accessible to other associated computers in the overall network.

Of course, the particular memory resource or location at which the measurements, library 32, and program memory 34 physically reside can be implemented in various locations accessible to system 20. For example, these data and program instructions may be stored in local memory resources within workstation 21, within server 30, or in network-accessible memory resources to these functions. In addition, each of these data and program memory resources can itself be distributed among multiple locations, as known in the art. It is contemplated that those skilled in the art will be readily able to implement the storage and retrieval of the applicable measurements, models, and other information useful in connection with this embodiment of the invention, in a suitable manner for each particular application.

According to this embodiment of the invention, by way of example, system memory 24 and program memory 34 store computer instructions executable by central processing unit 25 and server 30, respectively, to carry out the functions described in this specification, by way of which a computer simulation of the behavior within a modeled volume of the desired sub-surface portion of the earth can be executed. These computer instructions may be in the form of one or more executable programs, or in the form of source code or higher-level code from which one or more executable programs are derived, assembled, interpreted or compiled. Any one of a number of computer languages or protocols may be used, depending on the manner in which the desired operations are to be carried out. For example, these computer instructions for creating the model according to embodiments of this invention may be written in a conventional high level language such as JAVA, FORTRAN, or C++, either as a conventional linear computer program or arranged for execution in an object-oriented manner. These instructions may also be embedded within a higher-level application. More specifically, it is contemplated that the simulation of the behavior of the modeled sub-surface volume may be carried out by way of a computer simulation software application or package operating according to the material point model (MPM) technique, such as the CARTABLANCA computer simulation environment licensable from the Los Alamos National Laboratory. In any case, it is contemplated that those skilled in the art having reference to this description will be readily able to realize, without undue experimentation, this embodiment of the invention in a suitable manner for the desired installations. These executable computer programs for carrying out embodiments of this invention may be installed as resident within system 20 as described above, or alternatively may be in the form of an executable web-based application that is accessible to server 30 and client computer systems such as workstation 21 for receiving inputs from the client system, executing algorithms modules at a web server, and providing output to the client system in some convenient display or printed form. Alternatively, these computer-executable software instructions may be resident elsewhere on the local area network or wide area network, or downloadable from higher-level servers or locations, by way of encoded information on an electromagnetic carrier signal via some network interface or input/output device. The computer-executable software instructions may have originally been stored on a removable or other non-volatile computer-readable storage medium (e.g., a DVD disk, flash memory, or the like), or downloadable as encoded information on an electromagnetic carrier signal, in the form of a software package from which the computer-executable software instructions were installed by system 20 in the conventional manner for software installation.

Operation of the Computerized System

Figure 4:
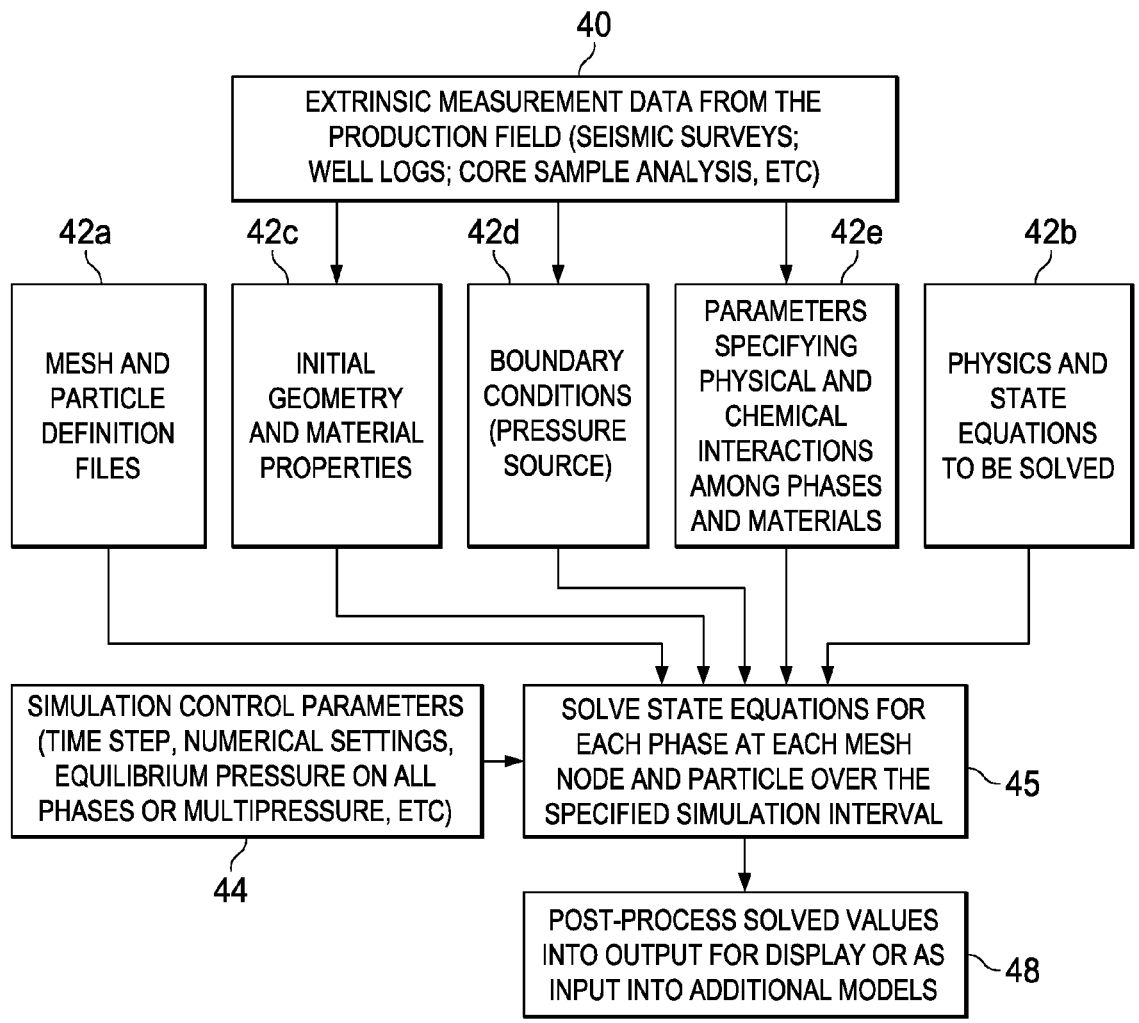
FIG. 4 is a flow diagram illustrating the operation of the system of FIG. 3 in the modeling and simulation of multi-phase interactions in the sub-surface of the earth in connection with the production of oil and gas products, according to embodiments of the invention.

FIG. 4 illustrates the generalized operation of system 20 in executing a simulation of fluid flow and structural degradation in a modeled volume of the sub-surface at an oil or gas reservoir, according to an embodiment of the invention. By way of example, this description will refer to data and simulation results pertaining to the mechanism of wormhole formation during CHOPS production; it is to be understood, of course, that this invention may alternatively be applied to the simulation of other mechanisms involved in oil and gas production. As discussed above, it is contemplated that the various steps and functions in this process can be performed by one or more of the computing resources in system 20 executing computer program instructions resident in the available program memory, in conjunction with user inputs as appropriate. While the following description will present an example of this operation as carried out at workstation 21 in the networked arrangement of system 20 shown in FIG. 3, it is of course to be understood that the particular computing component used to perform particular operations can vary widely, depending on the system implementation. As such, the following description is not intended to be limiting, particularly in its identification of those components involved in a particular operation. It is therefore contemplated that those skilled in the art will readily understand, from this specification, the manner in which these operations can be performed by computing resources in these various implementations and realizations. Accordingly, it is contemplated that reference to the performing of certain operations by system 20 will be sufficient to enable those skilled readers to readily implement embodiments of this invention, without undue experimentation.

As mentioned above, it is contemplated that system 20 will be programmed, according to embodiments of this invention, with computer programs that, when executed by computing resources in system 20, will carry out the various processes described in this specification for simulations of the sub-surface of the earth as specified by various physical parameter values and relationships. An example of suitable computer software in which embodiments of this invention have been observed to be successfully implemented, is the CARTA-BLANCA computer simulation environment available and licensable from Los Alamos National Laboratory. The CARTABLANCA computer software is described in Giguere et al., "CartaBlanca User's Manual", Los Alamos National Laboratory Report No. LA-UR-07-8214 (2007); and Zhang et al., "CartaBlanca Theory Manual: Multiphase Flow Equations and Numerical Methods", Los Alamos National Laboratory Report No. LAUR-07-3621 (2007), both available at http://www.lanl.gov/projects/CartaBlanca/, and both incorporated herein by this reference.

FIG. 4 illustrates a generalized flow diagram for the desired simulation of the behavior of fluid and solid phases in the sub-surface, in the context of an oil and gas reservoir, according to embodiments of this invention in which a material point model (MPM) method expresses multiple phases of the modeled volume, including a solid phase that degrades or deforms in response to or along with the flow of a fluid. As described above, the MPM approach expresses the modeled volume by both a Eulerian mesh and Lagrangian integration points, with the Eulerian mesh remaining fixed through the simulation time while the Lagrangian points move through the mesh as the material deforms. More specifically, the flow of a fluid within the modeled volume can be analyzed with respect to the Eulerian mesh (or grid), while the degradation of a solid material within that volume can be analyzed as particles of that material corresponding to the Lagrangian integration points. According to embodiments of this invention, the simulation must of course be designed to represent the modeled volume and the various phases in that context. In the flow diagram of FIG. 4, this design of the grid or mesh for the modeled volume and the particles within that volume are specified by the user of system 20 by way of definition files 42a, which are stored in and retrieved from library 32 or another memory resource within system 20. In a general sense, definition files 42 define the Eulerian grid representative of the modeled volume, in the conventional manner for Eulerian-type models and simulation (e.g., finite element models), including the locations of mesh nodes, the sizes of grid cells (i.e., distances between adjacent mesh nodes), and the like. In the context of the CARTABLANCA simulation environment, this grid represented in definition files 42 may be defined as an unstructured or structured grid of triangular, quadrilateral, tetrahedral, hexahedral elements; it is contemplated, in this regard, that an unstructured grid can more readily enable the modeling and simulation of complex geometrical shapes and mathematical domains. The coordinate systems for the grid defined by files 42 may be Cartesian, cylindrical, or spherical, also under user selection. Definition files 42 also specify the coordinates of the Lagrangian points (i.e., particles) within the modeled volume. For purposes of this description, elements within the defined Eulerian grid for the modeled volume will be referred to by way of "mesh nodes", it being understood that either grid cells (i.e., the volume between mesh nodes) or mesh nodes (i.e., the vertices of grid cells) may be the fundamental unit, depending on user and system preference. Also for purposes of this description, the Lagrangian integration points represented in the modeled volume will be referred to as "particles", it being understood that these integration points may correspond to phase elements other than particles, or to no physical particle but rather a mathematical representation of the phase.

In embodiments of this invention, as will be described in detail below, the simulation of the multiphase behavior in the modeled volume defined by definition files 42 will be carried out by numerical solution of a system of equations of state for the relevant materials and phases. Accordingly, the simulation requires specification of those equations of state, in order to define the desired simulation. According to embodiments of this invention, the equations of state and expressions of the physics involved in the simulation are provided as inputs 42b. These equations and expressions will be ultimately the subject of numerical solution, and as such the particular form of inputs 42b will correspond to the simulation and numerical engine of system 20 in executing this process.

For the example of the CARTABLANCA simulation environment, the physics inputs included within inputs 42b include user-specified indications of the physical processes to be modeled (e.g., a flow system and a momentum system, for the example of wormhole formation in CHOPS), relevant physical constants to those processes, and the particular simulation algorithms to be used for their solution. For example, inputs 42b may specify the user selection of a flow system for momentum transport of material in the simulation, the number of phases to be modeled by way of a Eulerian algorithm and the number of phases to be modeled by a particle-in-cell (i.e., MPM) algorithm, and the like. The particular equations of state to be solved are thus determined by the selection of the processes and simulation algorithms to be applied as made within inputs 42b, and are thus resident within the executable simulation software, as will be described below.

In the oil and gas context, as known in the art, various sources of extrinsic inputs 40 are available for use in constructing a realistic model of the sub-surface volume of interest in the desired simulation. As shown in FIG. 4, these extrinsic inputs 40 include measurement data relevant to the modeled volume constituting at least part of the production field of interest. Examples of those measurement data include the results of seismic surveys of that region of the earth, the results of conventional well logs and core sample analysis, and the like. In addition, other information corresponding to measurements or analysis of the earth in connection with previous exploration or production activity, as well as structural data deduced from other models and simulations pertaining to the relevant modeled volume, can also be included in extrinsic data 40 that are useful to this overall process.

For purposes of simulation according to embodiments of this invention, extrinsic data 40 are expressed into the simulation executed by system 20 by way of various inputs 42c, 42d, 42e, as shown in FIG. 4. Inputs 42c correspond to specification of the geometry of the modeled volume and the structures within that volume, and properties of the materials of the phases within that volume at the relevant locations. For example, if the modeled volume corresponds to a portion of UCS formation 10 near wellbore 4, some locations of the modeled volume will represent UCS formation 10 and perhaps others will represent the formations on one side or another of that formation 10. One class of inputs 42c are the properties of the material to be represented by particles in the MPM algorithm, which correspond to the frangible material that may be damaged or deformed by the action of fluid movement through the structure; for these particles, inputs 42c will include values for parameters such as how many computational particles are to reside within each mesh node in each of the dimensions (x, y, z) in the simulation to be performed, whether those particles are damaged, if subject to a damage model (as will be described in detail below), and material property values such as viscosities, stress moduli, Poisson ratio, and the like. Inputs 42c also include such material properties as appropriate for the fluid phase, in the example of wormhole formation in CHOPS. The particular material properties included within inputs 42c will, of course, depend on the desired simulation.

Inputs 42d represent boundary conditions of the modeled volume. These boundary conditions will typically be based on extrinsic data 40, in particular the location and nature of interfaces between a producing formation of interest (e.g., a UCS) and an adjacent confining formation such as an impermeable rock. More generally, these boundary conditions will express whether the boundary is reflective or transmissive (and the extent to which the boundary is so), whether a pressure is exerted on the modeled volume at that boundary (e.g., a drive source such as an aquifer in the oil and gas context), whether fluid is coming into the modeled volume or exiting the volume model at that boundary, and the like.

For embodiments of the invention, an important mechanism in the desired simulation is the interaction among phases and materials in the modeled volume. For the case of the simulation of wormhole formation in CHOPS, this interaction includes the action of flowing oil on particles of the unconsolidated sand, both in causing the sand to be damaged (i.e., breaking of a particle from the sand formation) and also in the flow of damaged sand particles entrained within the flowing oil. As such, inputs 42e pertain to the physical and chemical interaction (as the case may be) among the various phases, and are provided to the simulation algorithm. For the case of oil-sand interaction, these inputs 42e include coefficients in the momentum exchange between those phases, such that the stress applied by the flowing oil to sand particles is taken into consideration in the simulation solution. Other phases may also be included within the modeled volume, some of which may have no interaction with one or more of the other phases in that volume. And other mechanisms such as thermal energy exchange, chemical reactions, and the like may also be specified by the parameters provided in inputs 42e. As before, it is contemplated that these inputs 42e are provided based on extrinsic measurement data 40, thus having real-world correspondence to the properties of those materials in the simulation being undertaken.

The user of system 20 also provides inputs 44 to the simulation that serve as control parameters to the simulation. These control parameter inputs 44 include values such as the length of time steps between solution points over the simulation period, the number of time steps (i.e., the product of which with the length of time step defines the simulation time period), whether pressure in the modeled volume is assumed to be constant over all phases (i.e., an equilibrium pressure condition) or if instead each phase carries its own pressure value, numerical settings such as an advection "Courant" number defining a tradeoff between solution stability and run time, the dimensions of the simulation (1-D, 2-D, or 3-D), and other numerical parameters that control the stability or operation of the simulation to be performed.

Upon definition of the various inputs 42 and parameters 44, simulation process 45 is then executed by system 20 to solve the various state equations in the system at each mesh node and particle. According to embodiments of this invention, for example as executed within the CARTABLANCA simulation environment, these state equations are partial differential equations that serve as the basis of the simulation. In a general sense, simulation process 45 is carried out by discretizing these partial differential equations, and numerical techniques such as Jacobian-free Newton-Krylov (JFNK) algorithms are applied to solve the system of equations at each time step, for each mesh node and particle. Those solved values at each time step, for example corresponding to the volume fraction of each phase within each grid cell within the modeled volume and to the pressure (or pressures) at those locations, are then stored in a memory resource of system 20. Upon completion of the simulation over the desired time interval, post-processing of those values into a usable output is performed in process 48. Process 48 may consist of generation of a visual display of the materials at the graphics display of workstation 21, for example as a sequence of snapshots of the volumes of each phase at each time step (or selected time steps) over the simulation period to allow the user to visualize the simulated behavior of the fluid and solid in the modeled volume, or a database of the solved values suitable for construction of an additional model or as inputs into a larger-scale simulation, or the like.

Figure 5:
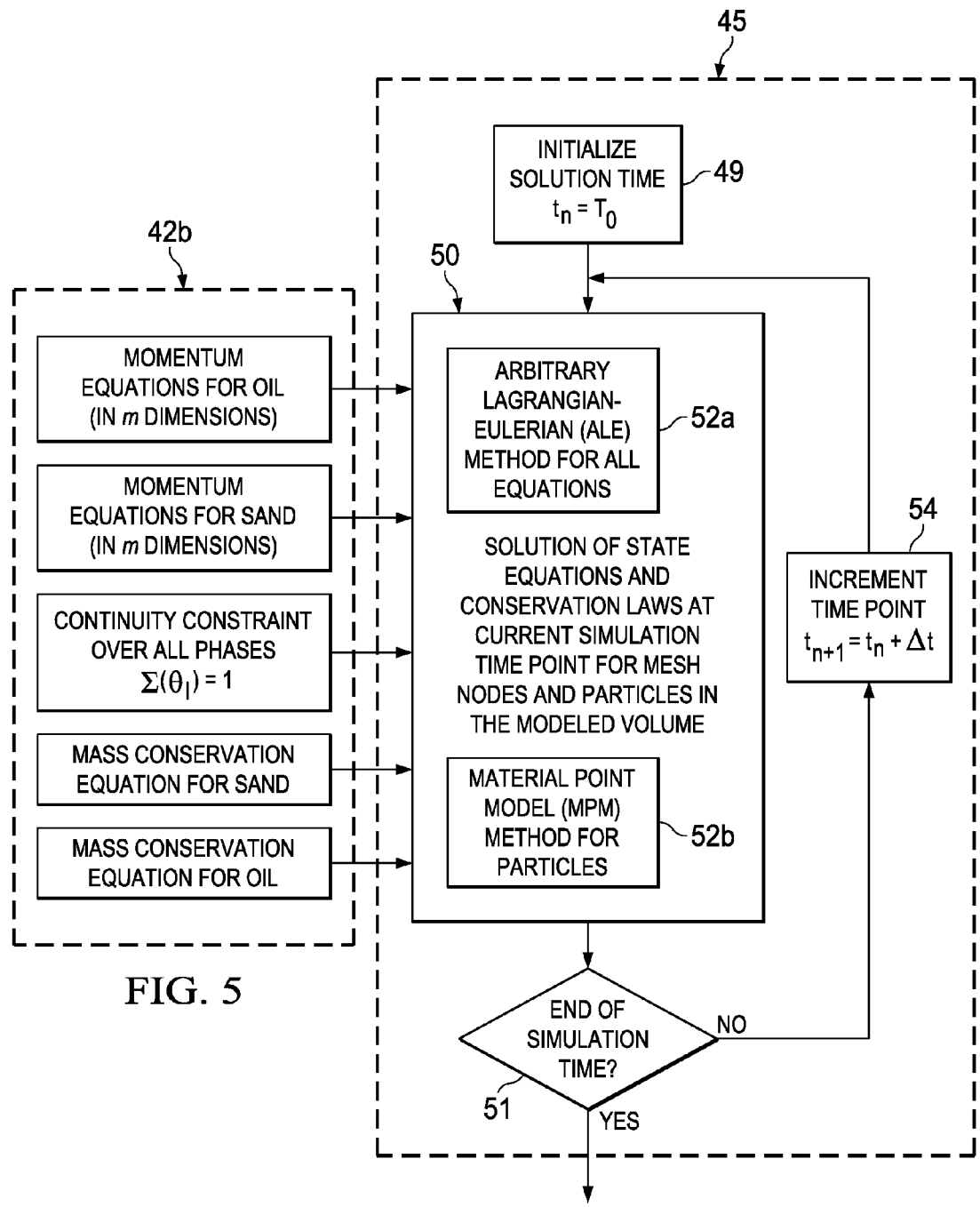
FIG. 5 is a flow diagram illustrating the operation of the system of FIG. 3 in solving systems of state equations in the modeling and simulation process of FIG. 4, according to embodiments of the invention.

FIG. 5 illustrates a highly generalized example of the operation of system 20 in executing simulation process 45 as applied to the context of wormhole formation in CHOPS. In this example, discretized versions of state equations 42b for the two phases of interest within the modeled volume, namely the flowing oil and the unconsolidated sand, are solved in process 45 at each time step for each mesh node and particle. In this example, these state equations 42b include momentum equations for each phase (oil and sand) in each dimension (i.e., two momentum equations per phase for a two-dimensional simulation), a mass conservation equation for each phase, and a continuity constraint corresponding to the modeled volume (i.e., the sum of all phase volume fractions equals 1). Referring back to the theory of operation described above, an example of the momentum equation for oil, in a single dimension, is provided by equation (1):

$$\theta_o \rho_o^0 \frac{du_o}{dt} = -\theta_o \nabla P + \nabla \cdot (\theta_o \sigma_v) - \theta_o \theta_s f_{so} \tag{1}$$

where $\theta_o$ is the volume fraction of oil, $\theta_S$ is the volume fraction of sand, $\rho_o^0$ is a nominal density of the oil, P is the pressure at the mesh node, $\sigma_v$ is a viscous stress tensor, $f_{so}$ represents an interaction between sand and oil in the nature of drag, and $u_o$ is the velocity vector of oil at that mesh node. As described above, the left side of the equation represents momentum of oil at the mesh node, with the right side of the equation corresponding to a sum of a pressure gradient term, a viscous stress term, and a term representing drag between the oil and sand. An example of the momentum equation for a sand particle, in a single dimension, is equation (2):

$$\theta_s \rho_s^0 \frac{du_s}{dt} = -\theta_s \nabla P + \nabla \cdot [\theta_s(\sigma_s + PI)] + \nabla \cdot (\theta_s \sigma_v) - \theta_o \theta_s f_{so} \tag{2}$$

where $\rho_S^0$ is a nominal density of the sand, P is the pressure at the location of the particle, $(\sigma_s+PI)$ represents a linear elastic stress term, and $u_o$ is the velocity of that particle of sand. In this example, the linear elastic stress tensor $\sigma_s$ assumes that the sand is a linear elastic material with non-linear damping, for example following the well-known relation:

$$\dot{\sigma}_s = E\dot{\varepsilon}_s - \frac{\sigma_s}{\tau_s(\varepsilon_s)} \tag{5}$$

and the material interaction force $f_{so}$ corresponds to a drag term that corresponds to Darcy flow in the steady-state, and depends on a sand permeability constant $\mu_o$:

$$f_{so} = \frac{\mu_o}{\kappa_s \theta_{s,undamaged}}(u_o - u_s) \quad (6)$$

As described above, the left side of equation (2) represents momentum of the sand particle, with the right side of the equation corresponding to a sum of a pressure gradient term, an elastic stress term, a viscous stress term, and a term representing drag between the oil and sand. The mass conservation state equations in this oil and sand case are provided by equations (3a) and (3b) for oil and sand, respectively:

$$\frac{\partial \theta_o}{\partial t} + \nabla \cdot (\theta_o u_o) = -\frac{\theta_o}{c_0^2 \rho_o}\left(\frac{\partial P}{\partial t} + u_o \cdot \nabla P\right) \quad (3a)$$

$$\frac{\partial \theta_s}{\partial t} + \nabla \cdot (\theta_s u_s) = 0 \quad (3b)$$

and the state equation expressing the continuity constraint for the two-phase case (oil and sand in this example) at each integration point is expressed as equation (4):

$$\theta_s + \theta_o = 1 \quad (4)$$

Interpolation of quantities between the mesh nodes and the particles is performed using the appropriate shape function (e.g., bi-linear interpolation). For the example of the CARTABLANCA simulation environment, quantities are approximated as an average value over a median mesh control volume that surrounds each mesh node.

In the simplified and generalized flow diagram of FIG. 5, process 45 begins with the initialization of the solution time $t_n$ to the desired time $t_0$ in process 49; this time $t_0$ of course corresponds to the point in time at which initial conditions specified by inputs 42c, 42d are valid, and from which the simulation is to begin. State equations 42 are then solved as a system of equations in process 50 at the current solution time $t_n$, after which decision 51 is executed by system 20 to determine whether the simulation time interval is complete. If not (decision 51 is "no"), the solution time is incremented to solution time $t_{n+1}$ by the time step $\Delta t$ indicated in control parameters 44, and process 50 is then repeated to again solve the state equations at that next simulation time, given the state of the phases, pressures, and the like expressed by the previous solution of those state equations.

More specifically, each iteration of state equation solution process 50 executes a numerical solution of a system of discretized equations, according to an appropriate numerical algorithm for such solution. In embodiments of this invention, as described above, solution process 50 can incorporate the MPM technique, particularly for addressing the damage of solid frangible material represented in the modeled volume by the flow of fluid and the pressure field, and the advection of damaged particles of that material with the fluid as driven by the pressure field. In a general sense, the fluid flow problem can be considered as the simulation of the fluid through the Eulerian grid and thus expressed by the conditions at and surrounding the mesh nodes of the modeled volume, while the frangible material can be considered as the simulated response expressed at the Lagrangian particles, with interaction between those two phases expressed in the state equations and by the continuity constraint. In the wormhole formation simulation, the frangible material of course corresponds to particles of sand, with the fluid corresponding to the oil flowing through the UCS formation to the wellbore due to reservoir pressure.

Solution process 50 may correspond to a numerical solution of the state equations that satisfies the continuity constraint at each time step, for each mesh node and particle. Under the CARTABLANCA simulation environment in this example, the momentum and mass conservation equations for the oil and sand phases may solved differently, for example with the momentum and mass conservation equations for the oil phase solved at each mesh node by way of an Arbitrary Lagrangian-Eulerian (ALE) algorithm 52a, and with the momentum and mass conservation equations for the sand phase solved for each particle at that same solution time by an MPM algorithm 52b. As described in Zhang et al., "CartaBlanca Theory Manual: Multiphase Flow Equations and Numerical Methods", supra, in this case resolution of the continuity constraint to account for interactions between these phases is numerically accomplished by generating "apparent" volume fractions at each mesh node (control volume surrounding each mesh node), because of the different solutions, and to arrive at the updated pressures in the modeled volume.

However, as mentioned above, the wormhole formation mechanism occurs over relatively small regions of the overall volume of the reservoir of interest, and also with significant changes occurring within those small volume regions over extremely short times (e.g., microseconds), because this mechanism is based on the time scale of elastic waves crossing the grid cells in the volume. The time scale for the overall simulation, however, will generally be required to extend over several days to several weeks, in order for the analyst to discover the extent and manner in which the wormholes will form over at least that length of time of oil production from the reservoir. But the computational capacity and computational time for solution process 45 to rigorously solve the state equations for each phase at each mesh node and particle in the modeled volume at each microsecond over several days, are thus prohibitively large, even using high-performance and high-capacity computer systems currently available.

According to an embodiment of the invention, a "time-splitting" approach is used to address this problem of wide separation in time scales. In a general sense, an outer solution cycle derives the simulation of the fluid motion, with relatively large time steps; a subcycle at much smaller time steps is performed periodically to evaluate the simulation of the stress state in the frangible material. For the simulation of wormhole formation in CHOPS, the subcycle evaluates the degradation of the unconsolidated sand over short time steps (e.g., on the order of microseconds) assuming the fluid state to be constant over each subcycle, while the outer cycle evaluates the fluid motion with entrained sand particles while assuming the stress on the remaining undamaged sand particles to be constant. In this manner, the degradation in the frangible material (e.g., unconsolidated sand formation at the locus of the wormhole formation) can be evaluated at a reasonable frequency, without burdening the evaluation of fluid flow over the longer time period. The simulation of the reservoir behavior in this situation can thus be efficiently evaluated by system 20 of modest computing capacity at reasonable computing times.

Figure 6:
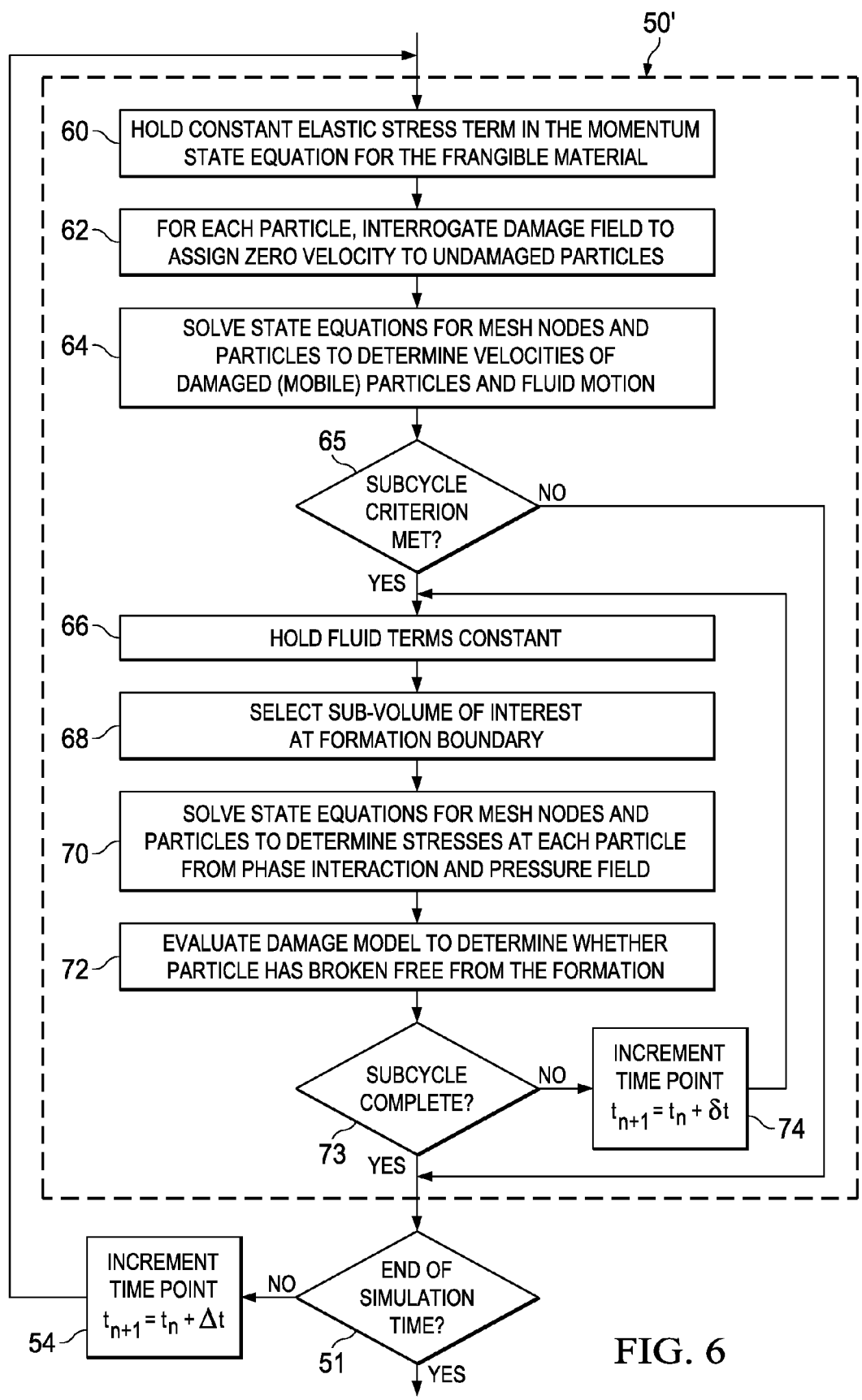
FIG. 6 is a flow diagram illustrating the operation of the system of FIG. 3 in simulating the mechanism of wormhole formation in a CHOPS production environment, according to an embodiment of the invention.

FIG. 6 illustrates process 50' as executable by system 20 in carrying out this time-splitting approach in an embodiment of the invention, for the example of wormhole formation in CHOPS. Process 50' corresponds to a species of process 50 shown in the more generalized flow diagram of FIG. 5, carrying out simulation process 45 in the higher level flow diagram of FIG. 4. As such, this description of process 50' will correspond to its execution at any one of the simulation time points $t_n$ in the overall simulation interval. In this embodiment of the invention, the incremental time step Δt applied in process 54 will correspond to the time step of the outer cycle of the time-split simulation, and as such will be a relatively large time step (e.g., on the order of one to several minutes) as compared with the time scale of wormhole formation, as will be described below.

At the beginning of an instance of process 50' at the current simulation time $t_n$, state equations 42 have been evaluated for previous simulation times, with values such as a current state of the pressure field in the modeled volume, fluid velocity at each mesh node (or grid cell), volume fractions of the oil and sand phases at each grid cell, and the like have been evaluated and are available. In this embodiment of the invention, each particle in the MPM model, which is representative of a corresponding sand particle (or other incremental element of the unconsolidated sand formation) is associated with a digital damage value (e.g., a "0" value indicating that the sand particle is undamaged and still part of the formation, and a "1" value indicating that the sand particle is damaged and thus mobile within the sub-surface). In addition, an elastic stress value is also associated with each undamaged particle (the elastic stress at each damaged, or freely mobile, particle being either insignificant or unimportant to the simulation).

Examples of state equations 42 that can be evaluated, in discretized form, by process 50' correspond to those described above, including momentum equations for each phase (oil and sand) for each dimension of the simulation, mass conservation equations for each phase, and a continuity constraint. In a more generalized sense, one can consider momentum equation (1) for oil:

$$\theta_o \rho_o^0 \frac{du_o}{dt} = -\theta_o \nabla P + \nabla \cdot (\theta_o \sigma_v) - \theta_o \theta_s f_{so} \quad (1)$$

in generalized form as:

momentum$_{oil}$=[pressure gradient term]+[viscous stress]−[oil-sand drag]    (1')

Similarly, one can consider momentum equation (2) for sand:

$$\theta_s \rho_s^0 \frac{du_s}{dt} = -\theta_s \nabla P + \nabla \cdot [\theta_s(\sigma_s + PI)] + \nabla \cdot (\theta_s \sigma_v) - \theta_o \theta_s f_{so} \quad (2)$$

in generalized form as:

momentum$_{sand}$=[pressure gradient term]+[elastic stress]+[viscous stress]+[oil-sand interaction]    (2')

The following description will refer to these more generalized terms in equations (1') and (2'), for clarity in the description.

Process 50' begins with process 60, for a current instance of simulation time $t_n$ incrementing at the larger time step Δt, in which system 20 defines the elastic stress term in the momentum equations (2') for sand to be held constant at their currently evaluated values. For the example of equation (2) above, the term [θ$_s$(σ$_s$+PI)] is considered constant, and thus can be effectively ignored because equation (2) is in the form of a differential equation. In process 62, system 20 interrogates the damage field for each particle in the MPM model of the modeled volume; for those currently undamaged particles for which the damage field is "0", the velocity u$_s$ is set to zero (corresponding to that sand particle being immobile in the formation), and for those currently damaged and mobile particles for which the damage field has a "1" value, the velocity u$_s$ is allowed to be determined according to the momentum equations, under the influence of oil in the grid cell within which that particle resides. In effect, processes 60, 62 define a state of the sand particles in the modeled volume in which the fluid motion of the oil is exerting no change in elastic stress on the sand particles, and in which the current solid unconsolidated sand formation is not being affected by the fluid motion—those particles that are already mobile flow with the oil, and those currently remaining in the formation remain in the formation. As such, at this current simulation time point $t_n$, evaluation of the state equations will not indicate further degradation of the frangible material (i.e., growth in the wormhole).

In process 64, system 20 solves the system of state equations, as constrained by processes 60, 62 described above, at simulation time $t_n$. The result of process 64 will be to update the velocities of oil and entrained mobile sand particles at each grid cell, thus reflective of fluid motion; in addition, the pressure field within the modeled volume will also be updated. According to equations (1) or (1'), the updated oil velocity u$_o$ at a grid cell is determined by the pressure gradient as exerted on the volume fraction of oil at that grid cell, a viscous term reflective of the viscous stress (i.e., resistance) of the fluid to the pressure gradient, and the interaction force representing the effect of drag on the motion of the oil as caused by sand particles in that grid cell. According to equations (2) and (2'), the velocity of a mobile sand particle within a grid cell is thus determined by the by the pressure gradient as exerted on the volume fraction of sand at that grid cell, a viscous term reflective of the viscous stress (i.e., resistance) of the particle, and the interaction force representing the effect of advection of the particle with the motion of the oil in that grid cell. Solution process 64 can be carried out by the appropriate numerical technique for these state equations, including such numerical techniques as JFNK algorithms applied to ALE and MPM models, as described above as available within the CARTABLANCA simulation environment. The resulting parameter values are then stored by system 20 in the appropriate memory resource.

System 20 then executes decision 65 to determine whether a predetermined criterion for initiating a subcycle is met. As mentioned above, the subcycle to be initiated is the evaluation of the elastic stresses in the sand particles, particularly in the previously undamaged sand particles, to determine the extent of wormhole formation; this subcycle is performed over much smaller time steps than the fluid motion solution of process 64. Various criteria for initiating a subcycle may be applied. For example, a subcycle may be initiated on a periodic basis over time, or periodically with the number of instances of process 64. Alternatively, the subcycle initiation criterion of decision 65 may be based on the result of process 64, for example if a change in velocity of oil exceeds a particular threshold. It is contemplated that those skilled in the art having reference to this specification can select an appropriate threshold for decision 65. If the criterion is not met (decision 65 is "no"), system 20 then executes decision 51 as before to determine whether the simulation interval is complete; if not, the simulation time is updated to time $t_{n+1}$ in process 54, and process 50' is repeated from process 60.

In the event that the subcycle initiation criterion is met (decision 65 is "yes"), the evaluation of the effects of the current state in the sub-surface on the formation, in this example on the unconsolidated sand, begins with process 66 in which system 20 defines the fluid terms in state equations 42 as constant. It is believed, in connection with this invention, that the changes in fluid flow over the short time steps (e.g., on the order of microseconds) that will be considered in this subcycle will be relatively insignificant. As such, those terms in state equations 42 that reflect changes in the flow parameter, including changes in the pressure field, are held constant. In the examples of equations (1) and (2) (for which equations (1') and (2'), respectively, are generalized forms), the interphase action or drag terms in each state equation are held constant, as is the pressure gradient. In addition, the fluid velocities in each grid cell are held constant, such that equation (1) and (1') will not be updated in this subcycle process. In process 68, a sub-volume of the modeled volume is selected for evaluation; because the formation of wormholes in this example occurs at the margins of the formation, the relevant volume of grid cells and corresponding particles can be kept quite small, including the region at the current location of the wormhole/formation interface. Alternatively, process 68 could be performed by evaluating the entire modeled volume.

In process 70, state equations 42 are evaluated at the current simulation time $t_n$, for the constant fluid terms and pressure gradient applied in process 66. In this process 70 within this subcycle, unlike process 64 in the outer cycle, the solid stress elastic stress term of $[\theta_S(\sigma_s+PI)]$ in equation (2) is evaluated and updated for each particle as part of the solution of the system of state equations. In particular, it is contemplated that the elastic stress tensor $\sigma_s$ in this term will be evaluated in terms of its components corresponding to normal stress (i.e., an overburden stress conducive to maintaining the particle in the formation) and shear stress (i.e., stress applied by oil flowing past the particle, tending to free the particle from the formation). In a general sense, according to embodiments of this invention, elastic and viscous stresses are considered in this evaluation of process 70. In addition, evaluation process 70 may further incorporate an elastic-plastic behavior law, for example if the sand to be considered as transitioning from elastic behavior to a plastic behavior before becoming entrained in the flowing oil. As mentioned above, solution process 70 is performed for each particle corresponding to the sub-volume selected in process 68.

In process 72, the results of solution process 70 are applied to a damage model to determine, for each particle of interest in the selected sub-volume, whether that particle has changed from an undamaged to a damaged state over the previous time interval. Various criteria may be applied in making this determination in process 72, in each case based on the results of solution process 70.

Figure 7:
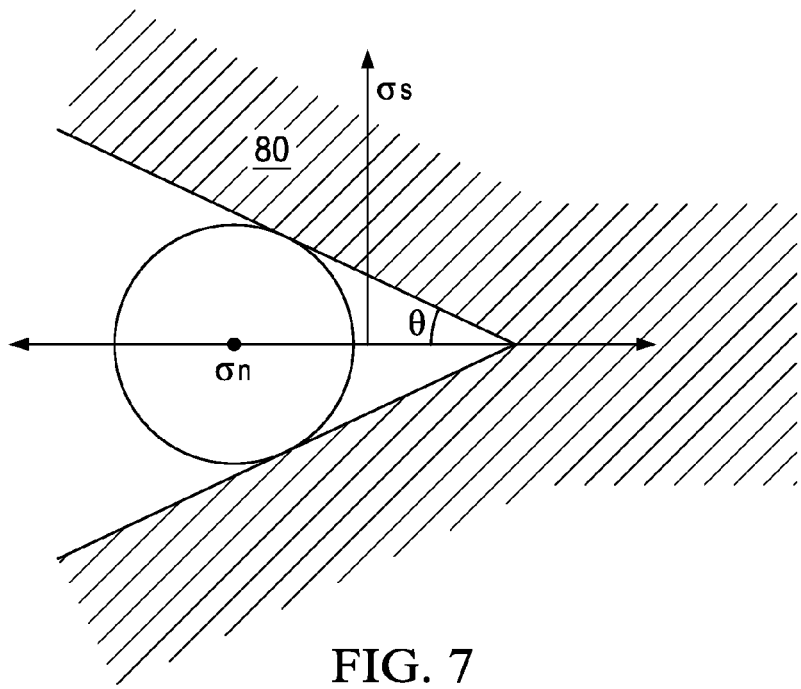
FIG. 7 is a graphical representation of a failure model applied to unconsolidated sand in the process of FIG. 6, according to an embodiment of the invention.

According to an embodiment of the invention, a material failure criterion is applied in process 72 as the damage model for this determination. An example of such a material failure criterion is the Mohr-Coulomb yield condition, which determines whether a material will undergo failure or fracture for given applied shear and normal stresses, as a function of the measureable mechanical strength properties of cohesion strength and the internal friction angle for the material. FIG. 7 graphically illustrates this example of the damage model applied in process 72, as a relationship of shear stress $\sigma_s$ and normal stress $\sigma_n$ calculated in process 70 for a particle with an internal friction angle $\theta$ and a given cohesive strength, where the cohesive strength corresponds to the shear stress axis intercept value of the lines defining failure region 80. In this example, if the shear stress $\sigma_s$ and normal stress $\sigma_n$ values calculated in process 70, for a given particle, define a point in the yield condition plot of FIG. 7 in failure region 80, that particle will be considered a damaged particle. The shear stress $\sigma_s$ at the particle, in that case, is sufficient to overcome the normal stress, allowing the particle to become entrained in and flow along with the oil. In process 72, the damage field value for this particle will be changed to "1" for the next iteration.

Upon completing processes 70, 72 for all particles in the selected volume, and the storing of the corresponding parameter solution values in a memory resource of system 20, decision 73 is executed to determine whether the subcycle is complete. The criterion for determining completion of the subcycle can be a count of process 70 instances completed, elapse of a selected time period, or a result-dependent criterion (e.g., fewer than a certain percentage of the particles changing state). In any event, if the subcycle is not complete, the simulation time $t_n$ is incremented by a small time step $\delta t$, which is much smaller than the time step $\Delta t$ between solutions in the outer cycle, and the subcycle process repeated from process 66. If desired, the selected sub-volume may change from iteration to iteration of this subcycle solution process 70, although it is contemplated that the sub-volume selected in process 68 will be sufficiently large to encompass migration of the formation-wormhole interface over the simulation interval for this subcycle.

Upon completion of the subcycle processing for this instance (decision 73 is "yes"), control returns to the outer loop, for example at decision 51 to determine whether the simulation time interval has completed. If a counter or timer is used to measure the subcycle initiation criterion, that counter or timer is re-initialized at this time, enabling the re-entry into the subcycle processing in a next instance. Solution process 45 then continues to completion, in the manner described above.

According to this embodiment of the invention, an efficient approach to the accurate simulation of short time scale mechanisms, such as wormhole formation in CHOPS, hydraulic fracturing, oil sand perforation, and the like is provided. Accuracy in the modeling and simulation of the short time scale phenomena is provided by the ability to rapidly evaluate the system of state equations over extremely short time steps, within the context of a longer term simulation of a larger volume, such as the production of oil and gas from a large reservoir or production field over longer periods of time. This combination of techniques improves the visibility of the human analyst into the mechanisms, locations, and behavior of structures in the sub-surface, including those that are damaged in production or well completion. The time-splitting approach according to this embodiment of the invention provides this accurate modeling of wormhole formation, within reasonable computational time and by way of computer systems of modest performance levels.

FIGS. 8a through 8e illustrating an example of the results of simulation of the mechanism of wormhole formation during CHOPS, at a location of UCS formation 10 near wellbore 4. These results are produced by post-processing a data base containing parameters solved via solution process 45, for example by data processing and image generation in an instance of post-process 48 of FIG. 4. In this example, the presence of wormhole 12 is indicated by changes in the porosity of formation 10 over time, as withdrawal of the oil and entrained sand continues over a simulation interval. FIGS. 8a through 8e illustrate the simulated sub-surface in this region at 5 days, 10 days, 15 days, 20 days, and 25 days, respectively. This porosity value corresponds to the volume fraction of the formation that is not occupied by the sand phase, at least to a first approximation; in this example, the increasing porosity indicated in each of these FIGS. 8a through 8e corresponds to the withdrawal of UCS from those locations. As evident from FIGS. 8a through 8e, the shape of wormhole 12 is not necessarily well-defined nor does this shape follow the conventional modeled representation as a wellbore. Simulations of wormhole formation according to embodiments of this invention have been verified, by scale model experiments, to reasonably correspond to physical wormholes. As such, it is contemplated that the simulation results provided by embodiments of this invention will be useful in more accurately predicting the degradation of sub-surface structures in oil and gas applications, such as CHOPS, hydraulic fracturing, oil sand perforation, and the like.

Referring back to FIG. 4, according to an alternative embodiment of the invention, data produced by system 20 in the solution of state equations over a simulation interval in solution process 45 of a model environment representative of the mechanism of wormhole formation during production from a UCS formation, are applied to post-process 48 to produce a larger-scale model applicable to secondary waterflooding, over a volume and distance scale extending to include a well-pair of an injector well and a producer well. Simulation of reservoir behavior on this well-pair scale is desirable, in order to evaluate the risk of a matrix bypass event in which a waterflood finger connects to a producer well wormhole in a given production field.

Figure 10:
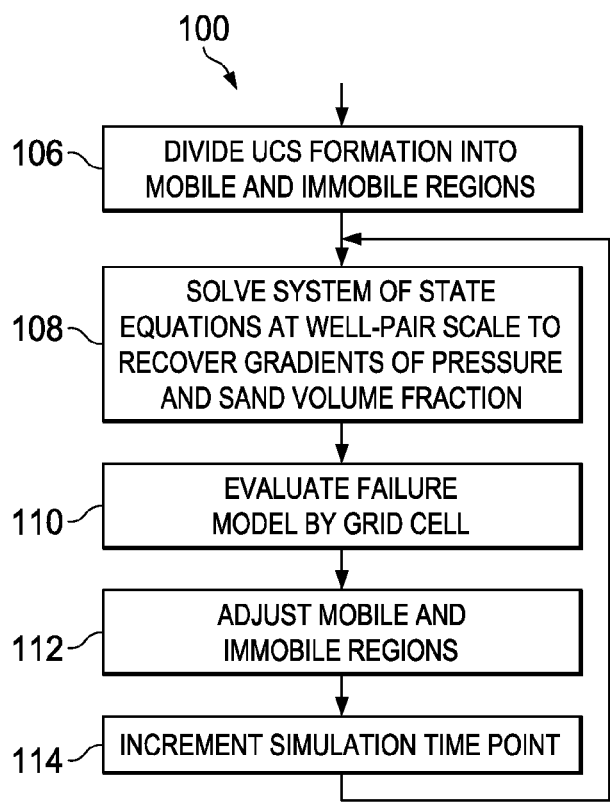
FIG. 10 is a flow diagram illustrating the application of an embodiment of the invention to a larger volume scale reservoir simulation.
Figure 8C:
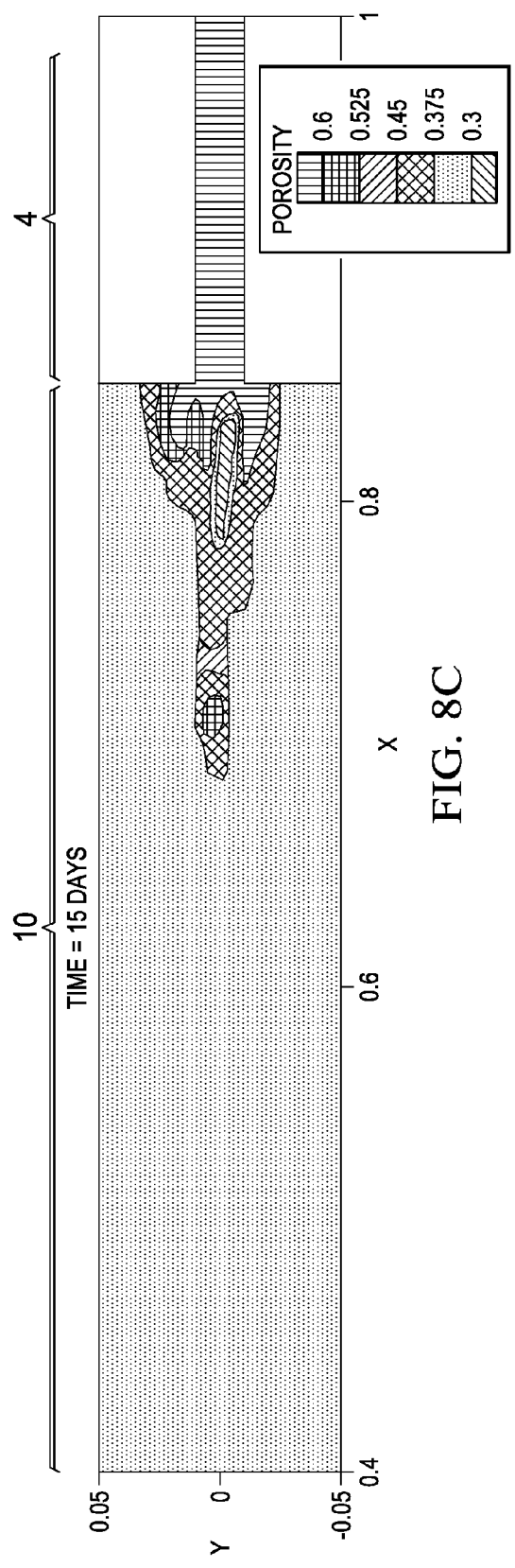
Figure 8D:
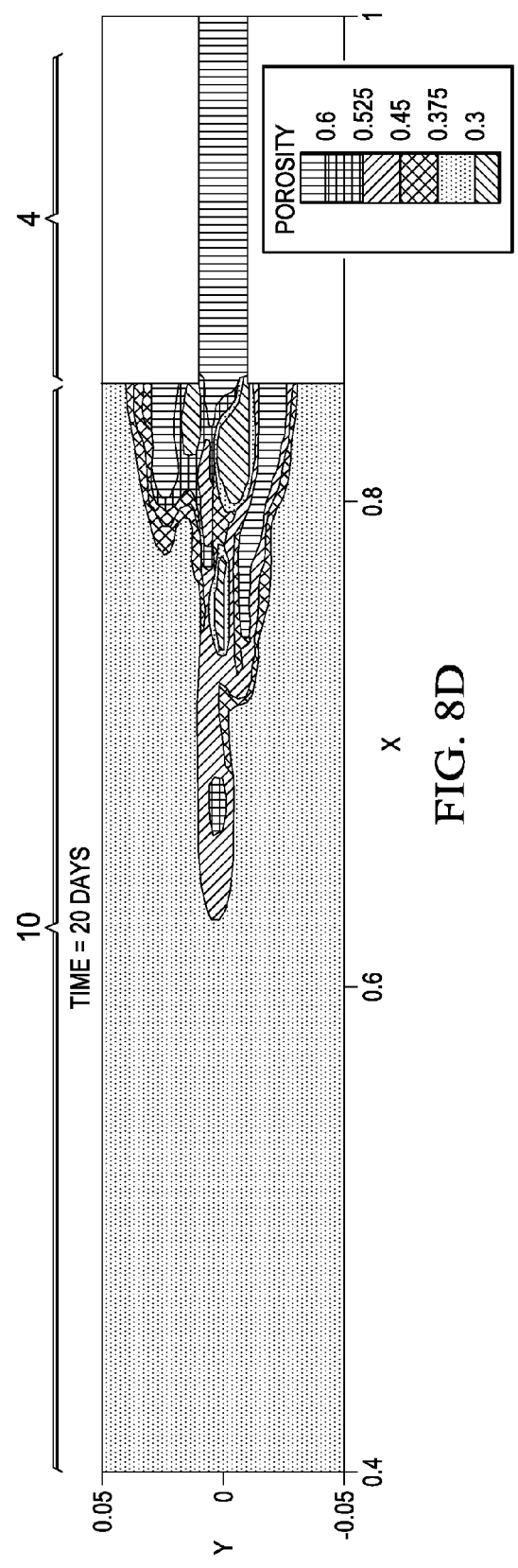
Figure 8E:
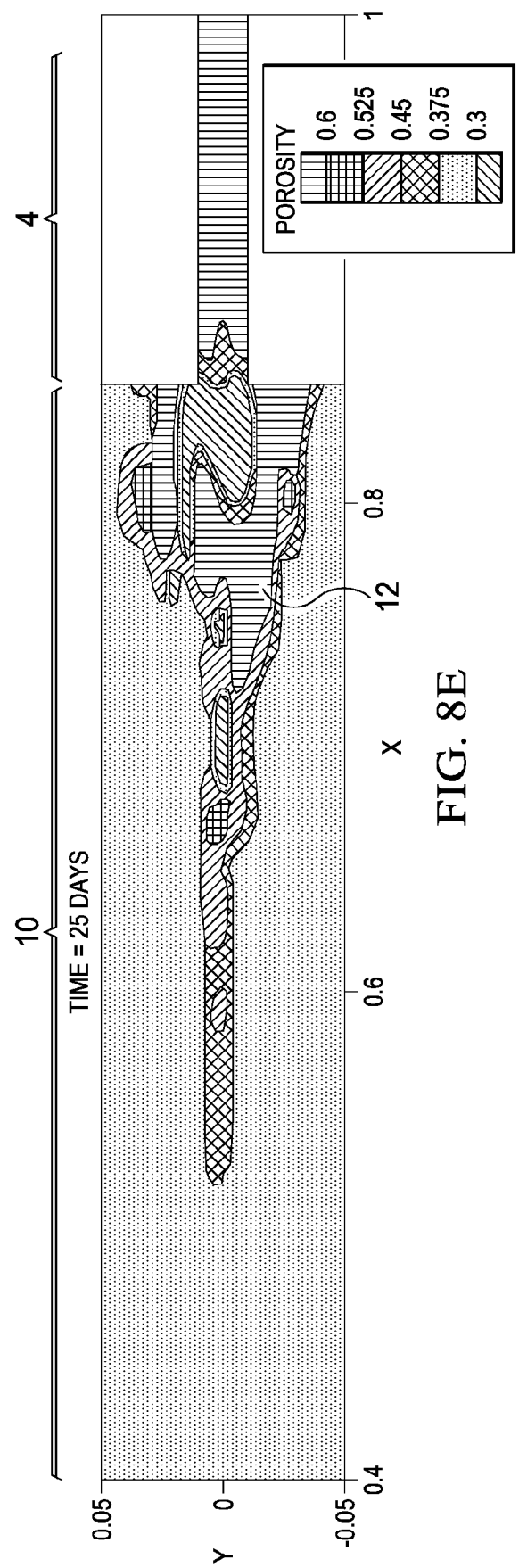
Figure 9:
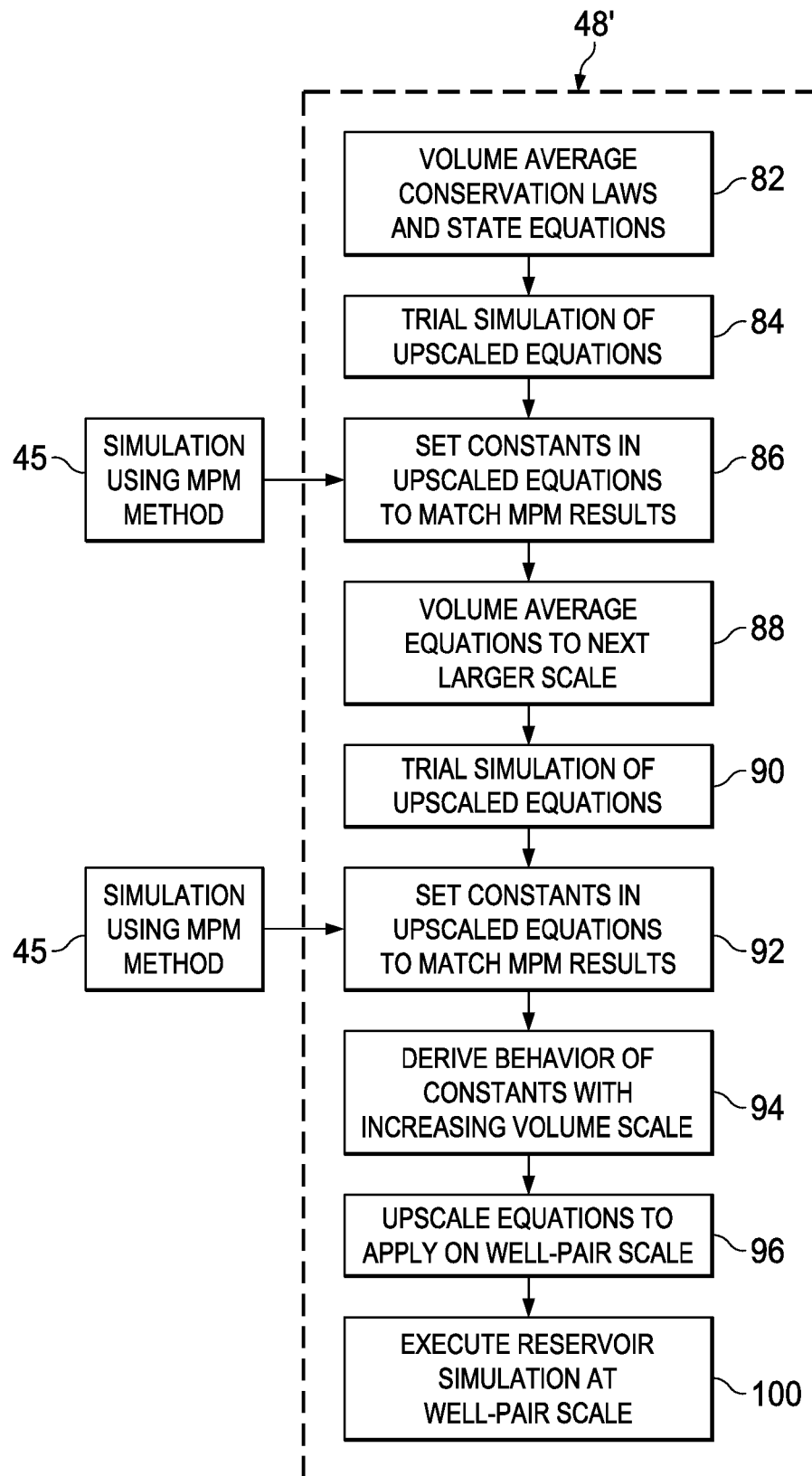
FIG. 9 is a flow diagram illustrating the operation of the system of FIG. 3 in applying the results of the simulation of FIG. 4 over a larger volume scale, according to an embodiment of the invention.

FIGS. 9 and 10 illustrate an example of post-process 48' in which the results of solution process 45 are upscaled to a much larger scale, such as over surface distances on the order of hundreds of meters and sufficient to include a pair of related wells (injector and producer), and used to simulate large scale wormhole formation. Post-process 48' in this example begins with process 82, in which the conservation laws and state equations applicable to the phases and formation of interest are volume averaged, for example to a volume on the order of several wormhole diameters. Examples of volume averaging of momentum state equations and the like are described in Zhang et al., "Averaged equations for inviscid two-phase flow", *J. Fluid Mechanics*, Vol. 267 (1994), pp. 185-219; Zhang et al., "The effects of mesoscale structures on phase interaction forces in two-phase flows and macroscopic equations", *Int. J. Multiphase Flow*, Vol. 28 (2001), pp. 805-22; and Zhang et al., "Pressure calculation in disperse and continuous multiphase flows", *Int. J. Multiphase Flow*, Vol. 33 (2007), pp. 86-100; and Zhang, "Ensemble phase averaged equations for multiphase flows in porous media; Part 2: a general theory", *Int. J. Multiphase Flow*, Vol. 35 (2009), pp. 640-49, all incorporated herein by this reference. In process 84, a trial simulation of formation behavior using the upscaled equations from process 82 is carried out by system 20. As known in the art, the volume-averaged equations from process 82 include constants for which the values are not known a priori or derivable as part of the volume averaging process; rather, the values of these constants are set by system 20 so that the simulation corresponds to sample results. This setting of the constants in the upscaled equations is carried out by system 20 in process 86, for example by comparing the results of simulation process 84 with the results of an instance of solution process 45 performed using MPM techniques on the same trial volume and conditions as that of process 84.

In process 88, the upscaled equations are again volume averaged to a larger scale than was applied in process 82, for example to on the order of 10% of the well-pair separation distance, and replacing the unknown terms in those volume averaged equations with models that have constants with unknown values. The values of these constants are then fit to the more fundamental models and simulations from the lower-length scale calculations, for example by performing a trial simulation using the upscaled equations at the larger volume scale in process 90, and comparing the results of trial simulation process 90 with the results of another instance of solution process 45 using the MPM method described above. This comparison sets the values of constants in the upscaled equations to conform the simulation results to the MPM results from solution process 45.

These multiple instances of deriving constants for the upscaled equations in processes 86, 92 serve as the basis for deriving the behavior of those constant values with increasing volume scale, which is performed by system 20 in process 94. As a result of this process 94, the values of those constants can now be applied to volume averaging of the state equations and conservation laws by system 20 in process 96, which extends the equations to the well-pair scale. Once upscaled to this larger volume scale, with projection of the values for the relevant constants determined by the variation of those parameters with the level of upscaling, the desired simulation of the reservoir behavior over time at the well-pair volume scale is carried out in process 100.

FIG. 10 illustrates an example of well-pair scale simulation process 100, which begins with process 106 in which UCS formation 10 is divided into regions having mobile sand (e.g., "damaged" sand as indicated by the damage field for MPM particles) and immobile sand (e.g., "undamaged" sand as indicated by the damage field for MPM particles). The system of state equations extended to the well-pair scale are then discretized and numerically solved in process 108 to obtain current values for each relevant parameter at grid cells throughout the modeled volume. In particular, it is contemplated that solution process 108 will recover estimates of the pressure gradient and of the gradient of the volume fraction of sand, throughout the portions of the modeled volume that are of interest in simulating the formation of wormholes and other structures.

Upon obtaining the solved parameters from process 108 at a current simulation time point, a failure model for the unconsolidated sand formation 10 is evaluated by system 20, in process 110, at each grid cell or point near the current margin between the solid formation and an existing wormhole, to determine the extent to which the wormhole has increased in size at this point in the simulation. According to this well-pair scale simulation, the failure model applied in process 110 compares the inner product of the pressure gradient $\nabla p_o$ and the volume fraction gradient for sand $\nabla \theta_s$ against a cohesion strength term, for example:

$$\nabla p_o \cdot \nabla \theta_s > 2\sigma_c |\nabla^2 \theta_s| \quad (5)$$

where $\sigma_c$ is the cohesion strength of the sand, subject to a noise constraint:

$$|\nabla \theta| > \frac{1}{60\Delta x} \quad (6)$$

in which $\Delta x$ is the grid cell size. The term $\nabla^2 \theta_s$ is an approximation of the curvature effect of the interface between the mobile and immobile sand regions. Of course, other failure models can be used in process 110 to reflect growth in the wormhole during the simulation interval.

Following failure model application process 110, some grid cells will be indicated as failed (i.e., equation (5) and noise constraint (6) are both met). Those now-mobile sand regions are adjusted in process 112 to reflect this failure of the sand at the corresponding location in the modeled volume. In this embodiment of the invention, at the well-pair scale, this adjustment is indicated by way of the permeability value for that grid cell in the overall reservoir model. For example, following sand failure being indicated in process 110 for a grid cell, the permeabilities of both oil and sand may be increased by a factor of ten. The simulation time point is then incremented in process 114, and the well-pair scale simulation of wormhole formation continues from process 102 as before.

Either after or in combination with process 48', other reservoir simulation algorithms, such as conventional simulation of waterflood effects from an injector well in the modeled volume, by way of which waterflood fingers can be formed, and oil production, can be performed. By virtue of this embodiment of the invention, however, improved simulation of the formation of wormholes is obtained, even at the large scales required for simulation and modeling of well-pair interaction.

It is contemplated that those skilled in the art having reference to this specification will be readily able to recognize additional applications and scaling that utilize the modeling and simulation of multi-phase interaction provided by embodiments of this invention. It is therefore contemplated that this invention will be of significant value in the analysis of sub-surface mechanisms as useful in the oil and gas industry, particularly those mechanisms resulting from the interaction of fluid with frangible portions of sub-surface strata, as described above. And as discussed above, embodiments of this invention enable the use of modern computer systems to carry out such modeling and simulation, despite the wide separation in time and distance scales among the various mechanisms.

While this invention has been described according to its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of operating a computer system to simulate the fluid and structural behavior of a volume of the earth near a wellbore, comprising the steps of:
    retrieving, from a memory resource in the computer system, parameters defining properties of at least one fluid phase at each of a plurality of mesh nodes in a grid representative of a sub-surface formation in the volume to be simulated, the parameters comprising a velocity parameter for fluid at each mesh node;
    retrieving, from a memory resource in the computer system, parameters defining properties for each of a plurality of particles of a frangible material within the volume, the parameters for each particle comprising a velocity parameter, and a damage parameter having possible states comprising undamaged and damaged;
    selecting initial pressure conditions at each of the plurality of mesh nodes;
    then, at each of a plurality of time steps over a simulation time period, solving a system of equations comprising a state equation for fluid flow at each of the plurality of mesh nodes and a state equation for particle behavior for each of the plurality of particles; and
    processing the results of the solving steps to estimate fluid flow and changes in the sub-surface formation over the simulation time period;
    wherein the solving step comprises:
        for each of a first plurality of time steps separated by a first time period:
            setting the velocity parameter to zero for each particle having a damage parameter in the undamaged state;
            setting an elastic stress term to a constant for each particle having a damage parameter in the undamaged state;
            then solving the state equation for fluid flow at each of the plurality of mesh nodes; and
            solving the state equation for particle behavior for each of the plurality of particles; and
        after the first plurality of time steps, for each of a second plurality of time steps separated by a second time period, the second time period being shorter than the first time period:
            setting the velocity parameter for fluid in each mesh node to a constant value corresponding to a recent value of the velocity parameter in that mesh node;
            then solving the state equation for particle behavior for each of a subset of the plurality of particles within a selected portion of the volume; and
            then, for each particle in the subset, evaluating a damage model responsive to one or more stress values determined in the solving step, to determine the state of the damage parameter for that particle.

2. The method of claim 1, wherein the retrieved parameters defining at least one fluid phase represent hydraulic fracturing fluid;
    and wherein the retrieved parameters defining particles of a frangible material represent a gas shale.

3. The method of claim 1, wherein the retrieved parameters defining at least one fluid phase represent heavy oil;
    wherein the retrieved parameters defining particles of a frangible material represent unconsolidated sand;
    wherein the state equation for fluid flow expresses momentum of the heavy oil at a mesh node in terms of a pressure gradient at the mesh node, viscous stress of the heavy oil at the mesh node, and material interaction with the unconsolidated sand at the mesh node;
    wherein the state equation for particle behavior expresses momentum of unconsolidated sand in terms of a pressure gradient at the particle, elastic stress at the particle, viscous stress at the particle, and material interaction of the particle with heavy oil;
    and wherein the system of equations further comprises equations corresponding to mass conservation laws for the heavy oil and the unconsolidated sand, and an equation corresponding to a volume fraction continuity constraint.

4. The method of claim 3, wherein the processing step comprises:
    volume averaging the system of equations to a first volume scale;
    executing a simulation of the behavior of a volume corresponding to the first volume scale using the volume averaged system of equations;
    setting values of constants in the volume averaged equations responsive to a comparison of the results of the executing step and a first instance of the step of solving the system of equations; and
    upscaling the volume averaged system of equations to a larger volume scale; and
    executing a simulation of the behavior of a volume corresponding to the larger volume scale using the upscaled system of equations.

5. The method of claim 1, wherein the retrieved parameters defining at least one fluid phase represent heavy oil;
    and wherein the retrieved parameters defining particles of a frangible material represent unconsolidated sand.

6. The method of claim 5, wherein the step of evaluating the damage model comprises:

determining a shear stress value and a normal stress value resulting from the solving step;

responsive to the shear stress value exceeding a limit corresponding to the normal stress value, setting the damage parameter of the particle to the damaged state.

7. The method of claim 5, further comprising:

after the second plurality of time steps, repeating the setting and solving steps for a third plurality of time steps separated by the first time period.

8. The method of claim 1, wherein the step of evaluating the damage model comprises:

determining a shear stress value and a normal stress value resulting from the solving step;

responsive to the shear stress value exceeding a limit corresponding to the normal stress value, setting the damage parameter of the particle to the damaged state.

9. The method of claim 1, further comprising:

after the second plurality of time steps, repeating the setting and solving steps for a third plurality of time steps separated by the first time period.

10. The method of claim 1, wherein the retrieved parameters defining at least one fluid phase represent heavy oil;

and wherein the retrieved parameters defining particles of a frangible material represent unconsolidated sand;

wherein the state equation for fluid flow expresses momentum of the heavy oil at a mesh node in terms of a pressure gradient at the mesh node, viscous stress of the heavy oil at the mesh node, and material interaction with the unconsolidated sand at the mesh node;

and wherein the state equation for particle behavior expresses momentum of an unconsolidated sand particle in terms of a pressure gradient at the particle, elastic stress at the particle, viscous stress at the particle, and material interaction of the particle with heavy oil.

11. A computer system for simulating the fluid and structural behavior of a volume of the earth near a wellbore, comprising:

a processing unit for executing program instructions;

a memory resource, coupled to the processing unit, for storing data representative of properties of at least one fluid phase at each of a plurality of mesh nodes in a grid representative of a sub-surface formation in the volume to be simulated, and data representative of properties for each of a plurality of particles of a frangible material within the volume, each particle associated with a damage parameter having possible states comprising undamaged and damaged; and program memory, coupled to the processing unit, for storing a computer program including program instructions that, when executed by the one or more processing units, causes the computer system to perform a sequence of operations comprising:

retrieving, from the memory resource, at least a portion of the data defining properties of at least one fluid phase at each of a plurality of mesh nodes in a grid representative of a sub-surface formation in the volume to be simulated;

retrieving, from the memory resource, at least a portion of the data defining properties for each of a plurality of particles of a frangible material within the volume;

selecting initial pressure conditions at each of the plurality of mesh nodes;

then, at each of a plurality of time steps over a simulation time period, solving a system of equations comprising a state equation for fluid flow at each of the plurality of mesh nodes and a state equation for particle behavior for each of the plurality of particles; and processing the results of the solving steps to estimate fluid flow and changes in the sub-surface structure formation over the simulation time period;

wherein the solving operation comprises:

for each of a first plurality of time steps separated by a first time period:

setting a velocity parameter to zero for each particle having a damage parameter in the undamaged state;

setting an elastic stress term to a constant for each particle having a damage parameter in the undamaged state;

then solving the state equation for fluid flow at each of the plurality of mesh nodes; and solving the state equation for particle behavior for each of the plurality of particles; and after the first plurality of time steps, for each of a second plurality of time steps separated by a second time period, the second time period being shorter than the first time period:

setting a velocity parameter for fluid in each mesh node to a constant value corresponding to a recent value of the velocity parameter in that mesh node;

then solving the state equation for particle behavior for each of a subset of the plurality of particles within a selected portion of the volume; and then, for each particle in the subset, evaluating a damage model responsive to one or more stress values determined in the solving step, to determine the state of the damage parameter for that particle.

12. The computer system of claim 11, wherein the at least one fluid phase comprises hydraulic fracturing fluid;

and wherein the frangible material comprises a gas shale.

13. The computer system of claim 11, wherein the at least one fluid phase comprises heavy oil;

wherein the frangible material comprises unconsolidated sand.

wherein the state equation for fluid flow expresses momentum of the heavy oil at a mesh node in terms of a pressure gradient at the mesh node, viscous stress of the heavy oil at the mesh node, and material interaction with the unconsolidated sand at the mesh node;

wherein the state equation for particle behavior expresses momentum of unconsolidated sand in terms of a pressure gradient at the particle, elastic stress at the particle, viscous stress at the particle, and material interaction of the particle with heavy oil;

and wherein the system of equations further comprises equations corresponding to mass conservation laws for the heavy oil and the unconsolidated sand, and an equation corresponding to a volume fraction continuity constraint.

14. The computer system of claim 13, wherein the processing operation comprises:

volume averaging the system of equations to a first volume scale;

executing a simulation of the behavior of a volume corresponding to the first volume scale using the volume averaged system of equations;

setting values of constants in the volume averaged equations responsive to a comparison of the results of the executing step and a first instance of the step of solving the system of equations; and upscaling the volume averaged system of equations to a larger volume scale; and executing a simulation of the behavior of a volume corresponding to the larger volume scale using the upscaled system of equations.

15. The computer system of claim 11, wherein the at least one fluid phase comprises heavy oil;
   and wherein the frangible material comprises unconsolidated sand.

16. The computer system of claim 15, wherein the operation of evaluating the damage model comprises:
   determining a shear stress value and a normal stress value resulting from the solving step;
   responsive to the shear stress value exceeding a limit corresponding to the normal stress value, setting the damage parameter of the particle to the damaged state.

17. A non-transitory computer-readable medium storing a computer program that, when executed on a computer system, causes the computer system to perform a sequence of operations for simulating the fluid and structural behavior of a volume of the earth near a wellbore, the sequence of operations comprising:
   retrieving, from a memory resource of a computer system, data representative of properties of at least one fluid phase at each of a plurality of mesh nodes in a grid representative of a sub-surface formation in the volume to be simulated;
   retrieving, from a memory resource of a computer system, data representative of properties for each of a plurality of particles of a frangible material within the volume, each particle associated with a damage parameter having possible states comprising undamaged and damaged;
   selecting initial pressure conditions at each of the plurality of mesh nodes;
   then, at each of a plurality of time steps over a simulation time period, solving a system of equations comprising a state equation for fluid flow at each of the plurality of mesh nodes and a state equation for particle behavior for each of the plurality of particles; and
   processing the results of the solving steps to estimate fluid flow and changes in the sub-surface formation over the simulation time period;
   and wherein the solving operation comprises:
      for each of a first plurality of time steps separated by a first time period:
         setting a velocity parameter to zero for each particle having a damage parameter in the undamaged state;
         setting an elastic stress term to a constant for each particle having a damage parameter in the undamaged state;
         then solving the state equation for fluid flow at each of the plurality of mesh nodes; and
         solving the state equation for particle behavior for each of the plurality of particles;
      after the first plurality of time steps, for each of a second plurality of time steps separated by a second time period, the second time period being shorter than the first time period:
         setting a velocity parameter for fluid in each mesh node to a constant value corresponding to a recent value of the velocity parameter in that mesh node; and
         then solving the state equation for particle behavior for each of a subset of the plurality of particles within a selected portion of the volume; and
      then, for each particle in the subset, evaluating a damage model responsive to one or more stress values determined in the solving step, to determine the state of the damage parameter for that particle.

18. The computer-readable medium of claim 17, wherein the at least one fluid phase comprises hydraulic fracturing fluid;
   and wherein the frangible material comprises a gas shale.

19. The computer-readable medium of claim 17, wherein the at least one fluid phase comprises heavy oil;
   wherein the frangible material comprises unconsolidated sand.
   wherein the state equation for fluid flow expresses momentum of the heavy oil at a mesh node in terms of a pressure gradient at the mesh node, viscous stress of the heavy oil at the mesh node, and material interaction with the unconsolidated sand at the mesh node;
   wherein the state equation for particle behavior expresses momentum of unconsolidated sand in terms of a pressure gradient at the particle, elastic stress at the particle, viscous stress at the particle, and material interaction of the particle with heavy oil;
   and wherein the system of equations further comprises equations corresponding to mass conservation laws for the heavy oil and the unconsolidated sand, and an equation corresponding to a volume fraction continuity constraint.

20. The computer-readable medium of claim 19, wherein the processing operation comprises:
   volume averaging the system of equations to a first volume scale;
   executing a simulation of the behavior of a volume corresponding to the first volume scale using the volume averaged system of equations;
   setting values of constants in the volume averaged equations responsive to a comparison of the results of the executing step and a first instance of the step of solving the system of equations; and
   upscaling the volume averaged system of equations to a larger volume scale; and
   executing a simulation of the behavior of a volume corresponding to the larger volume scale using the upscaled system of equations.

21. The computer-readable medium of claim 17, wherein the at least one fluid phase comprises heavy oil;
   and wherein the frangible material comprises unconsolidated sand.

22. The computer-readable medium of claim 21, wherein the operation of evaluating the damage model comprises:
   determining a shear stress value and a normal stress value resulting from the solving step;
   responsive to the shear stress value exceeding a limit corresponding to the normal stress value, setting the damage parameter of the particle to the damaged state.

* * * * *